US012808952B2

(12) United States Patent
Egawa

(10) Patent No.: US 12,808,952 B2
(45) Date of Patent: Nov. 24, 2026

(54) MAGNETIC SENSOR DEVICE

(71) Applicant: Hirose Electric Co., Ltd., Yokohama (JP)

(72) Inventor: Kosuke Egawa, Yokohama (JP)

(73) Assignee: HIROSE ELECTRIC CO., LTD., Yokohama (JP)

( * ) Notice: Subject to any disclaimer, the term of this patent is extended or adjusted under 35 U.S.C. 154(b) by 176 days.

(21) Appl. No.: 18/806,451

(22) Filed: Aug. 15, 2024

(65) Prior Publication Data

US 2025/0060424 A1 Feb. 20, 2025

(30) Foreign Application Priority Data

Aug. 17, 2023 (JP) ................................ 2023-132972

(51) Int. Cl.
*G01R 33/00* (2006.01)
*G01D 5/14* (2006.01)
*G01R 33/07* (2006.01)

(52) U.S. Cl.
CPC ......... *G01R 33/0011* (2013.01); *G01D 5/142* (2013.01); *G01R 33/0047* (2013.01); *G01R 33/072* (2013.01)

(58) Field of Classification Search
None
See application file for complete search history.

(56) References Cited

U.S. PATENT DOCUMENTS

2015/0061662 A1* 3/2015 Ausserlechner ... G01R 19/0092 324/252
2022/0099462 A1* 3/2022 Egawa ..................... G01D 5/20

FOREIGN PATENT DOCUMENTS

WO 2016021074 A1 2/2016

* cited by examiner

*Primary Examiner* — Farhana A Hoque
(74) *Attorney, Agent, or Firm* — Procopio, Cory, Hargreaves & Savitch LLP

(57) ABSTRACT

It is an object to make it possible for magnetic sensors to be readily disposed in such a manner that the position of the magnetic sensors relative to the rotary shaft corresponds to the design position. The magnetic sensor device 3 comprises a magnetic sensor 4 having a magnetic wire rod that generates a large Barkhausen effect, a yoke 21, a casing 22 in which the magnetic sensor 4 and the yoke 21 are accommodated, and sensor securing portions 28 for securing the casing 22 to a substrate. The terminals 15 of the magnetic sensor 4 are compression terminals, and, as the casing 22 is secured to the substrate by the sensor securing portions 28, the terminals 15 are pressed against conductor portions on the substrate and are electrically connected to the conductor portions.

4 Claims, 13 Drawing Sheets

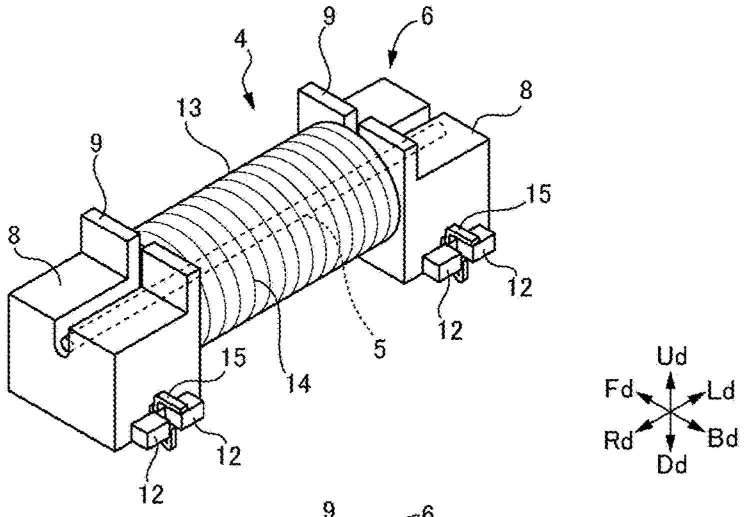
FIG. 5 (A)
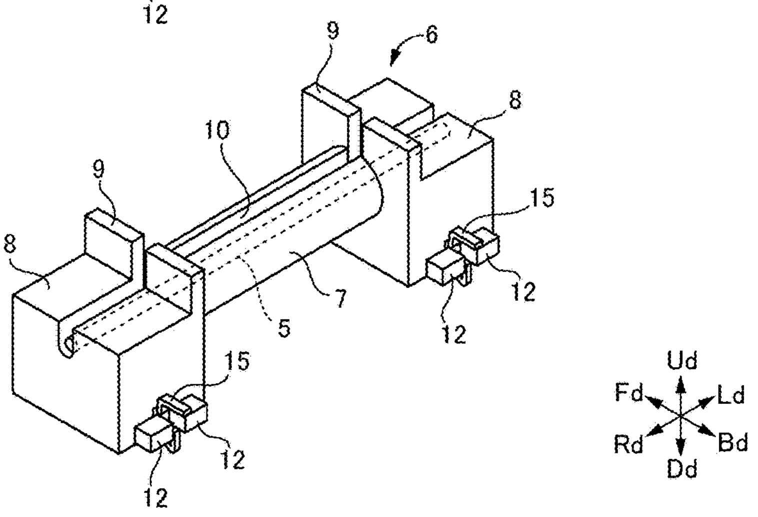
FIG. 5 (B)
FIG. 6
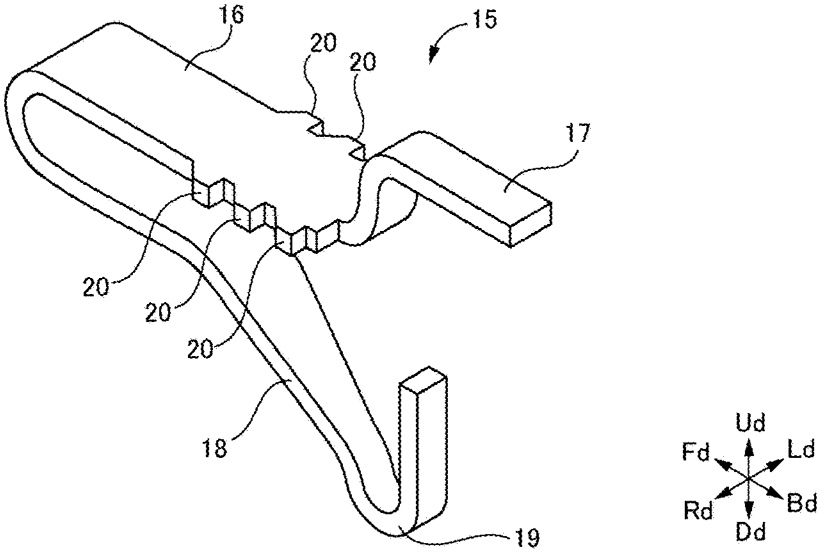

MAGNETIC SENSOR DEVICE

CROSS-REFERENCE TO RELATED APPLICATIONS

This application claims priority to Japanese Patent Application No. 2023-132972, filed Aug. 17, 2023, the contents of which are incorporated herein by reference in its entirety for all purposes.

BACKGROUND

Field

The present invention relates to a magnetic sensor device that utilizes a large Barkhausen effect.

Background Art

A magnetic sensor that utilizes a large Barkhausen effect comprises a magnetic wire rod that generates a large Barkhausen effect, a bobbin having the magnetic wire rod disposed therein, a coil formed by winding an electrical wire around the bobbin, and two terminals used to connect the coil to an external sensing circuit. The two terminals are respectively secured at opposite ends of the bobbin. Of the two terminals, one terminal is connected to one end of the electrical wire that forms the coil, and the other terminal is connected to the other end of the electrical wire that forms the coil. The magnetic sensor is electrically connected to circuitry on the substrate by, for example, soldering the respective ends of the two terminals to pads or other conductor portions provided on the substrate. In addition, soldering each terminal to a conductor portion secures the magnetic sensor to the substrate and fixes the position of the magnetic sensor on the substrate. An example of such a magnetic sensor is described in International Publication No. 2016/021074 (Patent Document 1).

For example, as described in International Publication No. 2016/021074, when magnetic sensors are used for sensing the rotation of a rotary shaft, magnets are secured to the outer perimeter of the rotary shaft such that a rotating magnetic field is formed at the outer periphery of the rotary shaft as the rotary shaft rotates. In addition, a plurality of magnetic sensors are provided on the substrate, and this substrate is provided at the outer periphery of the rotary shaft in a manner free of contact with the rotary shaft and the magnets. The plurality of magnetic sensors are disposed in proximity to the rotational trajectory of the magnets in respectively different positions in the direction of rotation of the magnets. This allows for the rotating magnetic field formed by the rotation of the rotary shaft to be sensed by the plurality of magnetic sensors and for the amount and direction of rotation, etc., of the rotary shaft to be sensed based on detection signals output from the coil of each magnetic sensor.

PATENT DOCUMENTS

Patent Document 1

International Publication No. 2016/021074.

SUMMARY

Problems to be Solved

For example, when forming a rotation sensing device for sensing the rotation of a rotary shaft with the help of magnetic sensors, a substrate having magnetic sensors provided thereon is provided at the outer periphery of the rotary shaft. In the prior art, when such a rotation sensing device is fabricated, first, the magnetic sensors are secured to the substrate by soldering, and the substrate, which has the magnetic sensors secured thereto, is then secured with brackets, etc., to, for example, a housing, etc., in which the rotary shaft is rotatably supported.

In order to increase the accuracy of detection of the rotation of the rotary shaft by the magnetic sensors, the magnetic sensors need to be disposed in such a manner that the position of the magnetic sensors relative to the rotary shaft, i.e. the distance between the axis of the rotary shaft and the magnetic sensors, etc., corresponds to the design position. Incidentally, in the course of fabricating a rotation sensing device, the position of the magnetic sensors relative to the rotary shaft may sometimes deviate from the design position.

It is believed that one of the reasons for such misalignment of the magnetic sensors relative to the rotary shaft is the misalignment of the magnetic sensors relative to the substrate during the soldering step wherein the magnetic sensors are soldered to the substrate. In addition, another reason for the misalignment of the magnetic sensors relative to the rotary shaft is the misalignment of the substrate relative to the housing during the substrate attachment step wherein the substrate having the magnetic sensors soldered thereto is attached to the housing, etc., in which the rotary shaft is rotatably supported. Therefore, for the magnetic sensors to be placed in such a manner that the position of the magnetic sensors relative to the rotary shaft corresponds to the design position, both the positioning of the magnetic sensors relative to the substrate during the soldering step and the positioning of the substrate relative to the housing, etc., during the substrate attachment step must be performed in a rigorous manner. Consequently, placing the magnetic sensors such that the position of the magnetic sensors relative to the rotary shaft corresponds to the design position is not an easy task.

The present invention has been devised, for example, by taking problems such as those described above into consideration, and it is an object of the present invention to provide a magnetic sensor device which, for example, when forming a rotation sensing device for sensing the rotation of a rotary shaft with the help of magnetic sensors, allows for the magnetic sensors to be readily placed such that the position of the magnetic sensors relative to the rotary shaft corresponds to the design position.

Technical Solution

In order to eliminate the above-described problems, the inventive magnetic sensor device, which comprises a magnetic sensor having a magnetic wire rod that generates a large Barkhausen effect, a bobbin having the magnetic wire rod disposed therein, a coil formed by winding an electrical wire around the bobbin, and two terminals provided in the bobbin and intended for respectively electrically connecting one end and the other end of the electrical wire to two conductor portions provided on the substrate, as well as sensor securing portions for securing the magnetic sensor to the substrate with fasteners, is characterized in that the two terminals are both compression terminals and, as the magnetic sensor is secured to the substrate by the sensor securing portions and the fasteners, the two terminals are respectively pressed against the two conductor portions and electrically connected to the two conductor portions.

In the prior art, the fabrication of a rotation sensing device for sensing the rotation of a rotary shaft with the help of magnetic sensors involves performing a soldering step wherein the magnetic sensors are soldered to a substrate and a substrate attachment step wherein the substrate having the magnetic sensors soldered thereto is attached to a housing, etc., in which the rotary shaft is rotatably supported, as a consequence of which the operator must perform both the positioning of the magnetic sensors relative to the substrate during the soldering step and the positioning of the substrate relative to the housing, etc., during the substrate attachment step in a rigorous manner in order to place the magnetic sensors such that the position of the magnetic sensors relative to the rotary shaft corresponds to the design position. By contrast, in the inventive magnetic sensor device, the magnetic sensors are secured to the substrate with the help of the sensor securing portions and the fasteners, thereby allowing for the two terminals of the magnetic sensors to be respectively pressed against and electrically connected to the two conductor portions of the substrate, which makes it possible for the operator to perform the operation of securing the magnetic sensors to the substrate after attaching the substrate to the housing, etc. For this reason, when securing the magnetic sensors to the substrate, the operator can perform the positioning of the magnetic sensors relative to the rotary shaft with the help of, for example, a positioning device comprising imaging means and image processing means, or a dedicated jig and the like, which allows for the magnetic sensors to be readily placed such that the position of the magnetic sensors relative to the rotary shaft corresponds to the design position. Since, in the first place, the soldering step, wherein the magnetic sensors are soldered to the substrate, is absent when using the inventive magnetic sensor device, there is no misalignment of the magnetic sensors relative to the substrate during the soldering step. In addition, even if the substrate becomes misaligned relative to the housing, etc., when attaching the substrate, on which no magnetic sensors have yet been provided, to the housing, etc., when the magnetic sensors are subsequently provided on the substrate, the position of the magnetic sensors relative to the substrate can be adjusted in such a manner that the position of the magnetic sensors relative to the rotary shaft corresponds to the design position, and the misalignment of the substrate relative to the housing, etc., can be absorbed by this adjustment.

In the aforementioned inventive magnetic sensor device, there may be provided a yoke that controls the direction of the magnetic flux of an external magnetic field, and a casing in which the magnetic sensor and the yoke are accommodated, and the sensor securing portions may be provided in the casing.

In addition, in the aforementioned inventive magnetic sensor device, there may be provided a plurality of magnetic sensors, and a casing in which the plurality of magnetic sensors are accommodated, and the plurality of magnetic sensors may be disposed on a single reference plane coincident with or parallel to the lower face of the casing at predetermined intervals in the circumferential direction about a reference line perpendicular to the reference plane and in such a manner that the direction of extension of the magnetic wire rods is parallel to the reference plane. In such a case, there may be provided a plurality of yokes that control the direction of the magnetic flux of an external magnetic field, with the plurality of yokes being provided in one-to-one correspondence with the plurality of magnetic sensors and furthermore, with the plurality of yokes being accommodated in the casing along with the plurality of magnetic sensors.

Effects of the Invention

In accordance with the present invention, for example, when forming a rotation sensing device for sensing the rotation of a rotary shaft with the help of magnetic sensors, the magnetic sensors can be readily placed such that the position of the magnetic sensors relative to the rotary shaft corresponds to the design position.

BRIEF DESCRIPTION OF THE DRAWINGS

FIG. 5(A) is a rear, top, right perspective view of a magnetic sensor used in the magnetic sensor device according to the inventive embodiment, and FIG. 5(B) is a rear, top, right perspective view of a bobbin used in said magnetic sensor.

FIG. 6 is a rear, top, right perspective view of a terminal used in the magnetic sensor of the magnetic sensor device according to the inventive embodiment.

DETAILED DESCRIPTION (Rotation Sensing Device)

Figure 1:
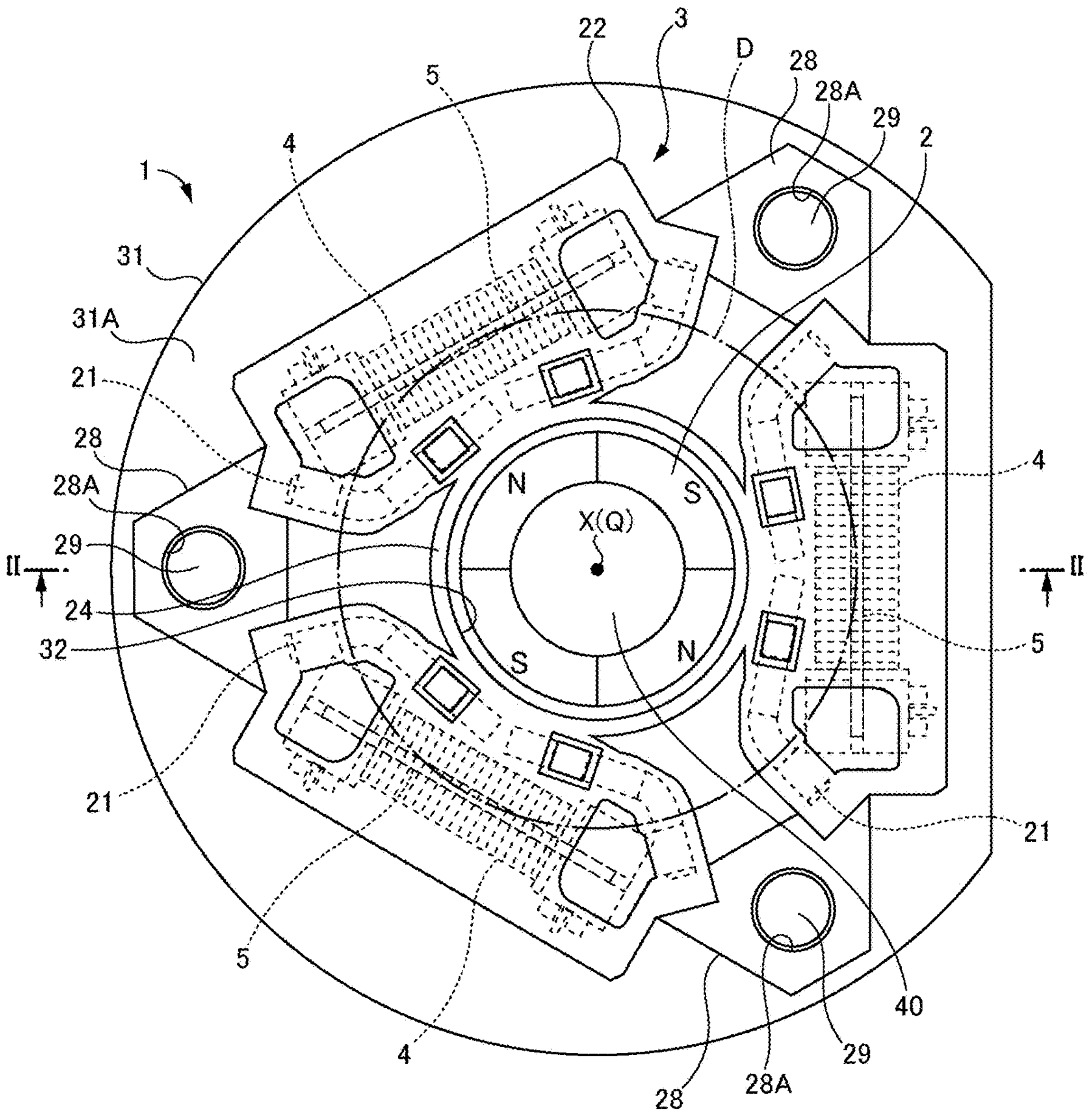
FIG. 1 is an illustrative top view of a rotation sensing device comprising a magnetic sensor device according to an inventive embodiment.
Figure 2:
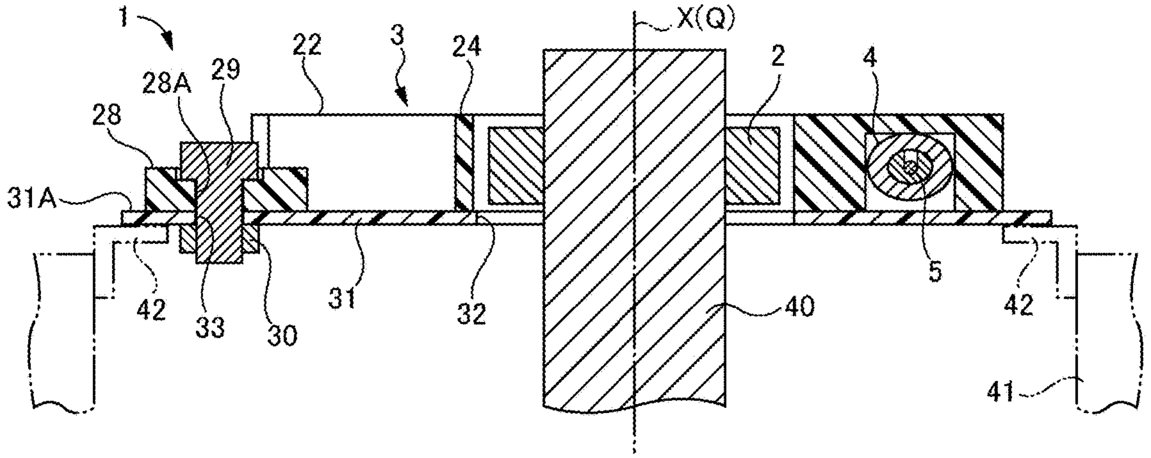
FIG. 2 is a lateral cross-sectional view of a cross-section of the rotation sensing device taken along section line II-II in FIG. 1.

FIG. 1 shows a top view of a rotation sensing device 1 comprising a magnetic sensor device 3 according to an inventive embodiment. FIG. 2 shows a lateral cross-section of the rotation sensing device 1 taken along section line II-II in FIG. 1 (from below in FIG. 1).

In FIG. 1, the rotation sensing device 1 is a device that senses the rotation of a rotary shaft 40 serving as a rotating body. For example, the rotary shaft 40 is the output shaft of a motor and the rotation sensing device 1 is assembled with said motor.

The rotation sensing device 1 comprises a magnetic field forming member 2 that forms a rotating magnetic field, a magnetic sensor device 3 sensing the rotating magnetic field, and a substrate 31.

The magnetic field forming member 2 is formed in an annular configuration from, for example, ferrite or another magnetic material. The magnetic field forming member 2 is disposed at the outer periphery of the rotary shaft 40 coaxially with the rotary shaft 40, and is secured to the rotary shaft 40. The magnetic field forming member 2 is a multi-pole-magnetized magnet with four magnetic poles, i.e., an N pole, an S pole, an N pole, and an S pole, formed, in this order, in the outer peripheral section of the magnetic field forming member 2 at, for example, 90-degree intervals in the circumferential direction of the magnetic field forming member 2. It should be noted that the magnetic field forming member 2 can also be formed from four magnets that have not been multipole magnetized.

The substrate 31 is provided at the outer periphery of the rotary shaft 40. In addition, the substrate 31 is provided in proximity to the magnetic field forming member 2. The substrate 31 is disposed such that the mounting face 31A thereof is facing up. In addition, as shown in FIG. 2, the substrate 31 is disposed such that a plane comprising the mounting face 31A is perpendicular to the axis of rotation X of the rotary shaft 40. In addition, a shaft insertion hole 32 is formed in the central part of the substrate 31 and the rotary shaft 40 is inserted into the shaft insertion hole 32. The center of the shaft insertion hole 32 is aligned with the center of rotation of the rotary shaft 40. In addition, the diameter of the shaft insertion hole 32 is larger than the outside diameter of the rotary shaft 40 and the rotary shaft 40 does not come into contact with the substrate 31. In addition, the substrate 31 is secured with brackets 42 to, for example, the housing 41 of the motor in which the rotary shaft 40 is rotatably supported.

As described below, the magnetic sensor device 3 is formed by accommodating and securing three magnetic sensors 4 and three yokes 21 within a single casing 22. In FIG. 1, the three magnetic sensors 4 and the three yokes 21 accommodated within the casing 22 are shown in dashed lines. The magnetic sensor device 3 is disposed on the mounting face 31A of the substrate 31 by placing the lower face of the casing 22 on the mounting face 31A of the substrate 31 while aligning a reference line Q located in the casing 22 with the axis of rotation X of the rotary shaft 40. In addition, as described below, the magnetic sensor device 3 is secured to the substrate 31 by a plurality of sensor securing portions 28 provided in the casing 22.

Once the magnetic sensor device 3 is disposed on the mounting face 31A of the substrate 31 in this manner, the three magnetic sensors 4 are disposed on the mounting face 31A of the substrate 31. In addition, the three magnetic sensors 4 are disposed at the outer periphery of the magnetic field forming member 2 at 120-degree intervals in the direction of rotation of the magnetic field forming member 2. In addition, each magnetic sensor 4 is disposed in such a manner that the direction of extension of the magnetic wire rod 5 is parallel to the mounting face 31A of the substrate 31. In addition, when the mounting face 31A of the substrate 31 is viewed from above, each magnetic sensor 4 is disposed in such a manner that the central part of the magnetic wire rod 5 in the direction of extension (strictly speaking, the central part of the central axis of the magnetic wire rod 5 in the direction of extension) is tangential to the circle D centered on the center of rotation of the rotary shaft 40, which is drawn at the outer periphery of the magnetic field forming member 2.

In addition, once the magnetic sensor device 3 is disposed on the mounting face 31A of the substrate 31 in the above-described manner, the three yokes 21 are disposed on the mounting face 31A of the substrate 31. The three yokes 21 are disposed in one-to-one correspondence with the three magnetic sensors 4. In addition, the three yokes 21 are disposed at the outer periphery of the magnetic field forming member 2 at 120-degree intervals in the direction of rotation of the magnetic field forming member 2. In addition, each yoke 21 is disposed to lie adjacent to a magnetic sensor 4 at the inner periphery of the magnetic sensor 4.

The magnetic field forming member 2 does not come into contact with the three magnetic sensors or the three yokes. In addition, the magnetic field forming member 2 rotates along with the rotary shaft 40 whereas the magnetic sensor device 3 remains stationary. When the magnetic field forming member 2 rotates along with the rotary shaft 40, the magnetic field formed by the magnetic field forming member 2 is set into rotation. This forms a rotating magnetic field rotating about the axis of rotation X of the rotary shaft 40. The three magnetic sensors 4 sense this rotating magnetic field. Specifically, the direction of the magnetic field acting on each magnetic sensor 4 changes because of the rotation of the magnetic field formed by the magnetic field forming member 2. Each magnetic sensor 4 outputs pulse signals corresponding to the changes in the direction of this magnetic field. The amount and direction of rotation, etc., of the rotary shaft 40 can be sensed based on the pulse signals output from each magnetic sensor 4.

(Magnetic Sensor Device)

Figure 3:
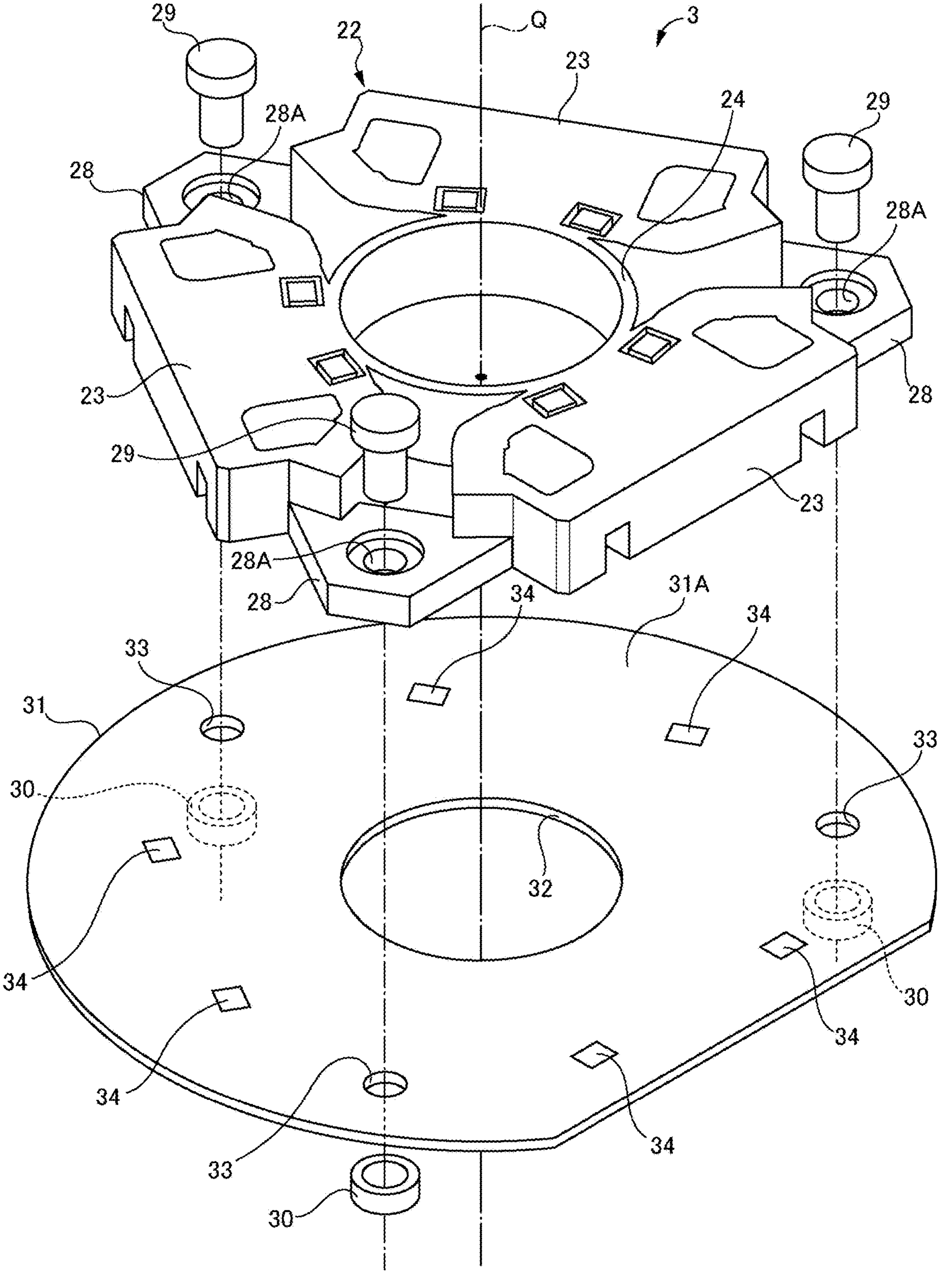
FIG. 3 is a perspective view of the magnetic sensor device according to the inventive embodiment and a substrate.
Figure 4:
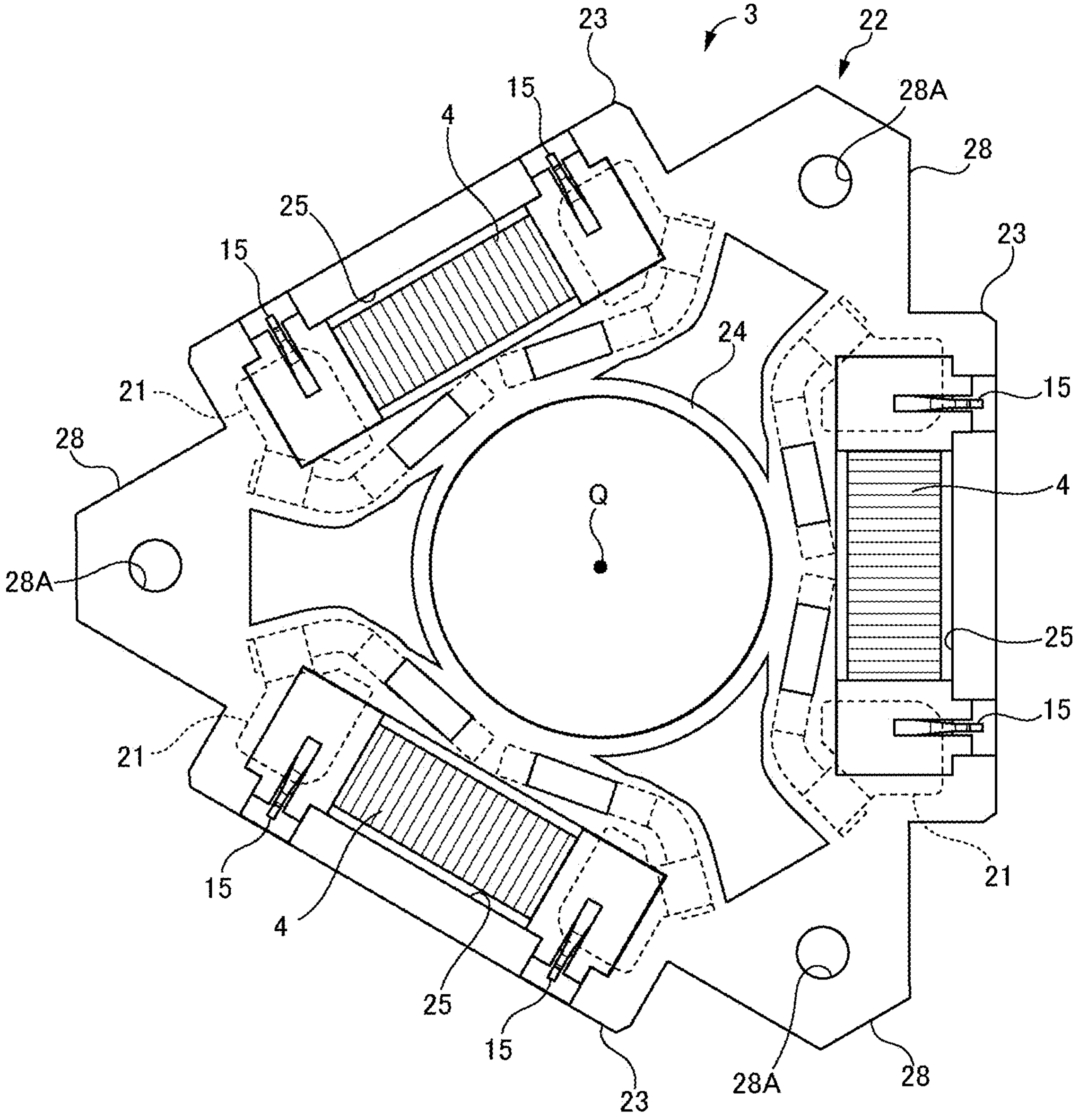
FIG. 4 is an illustrative bottom view of the magnetic sensor device according to the inventive embodiment.
Figure 7:
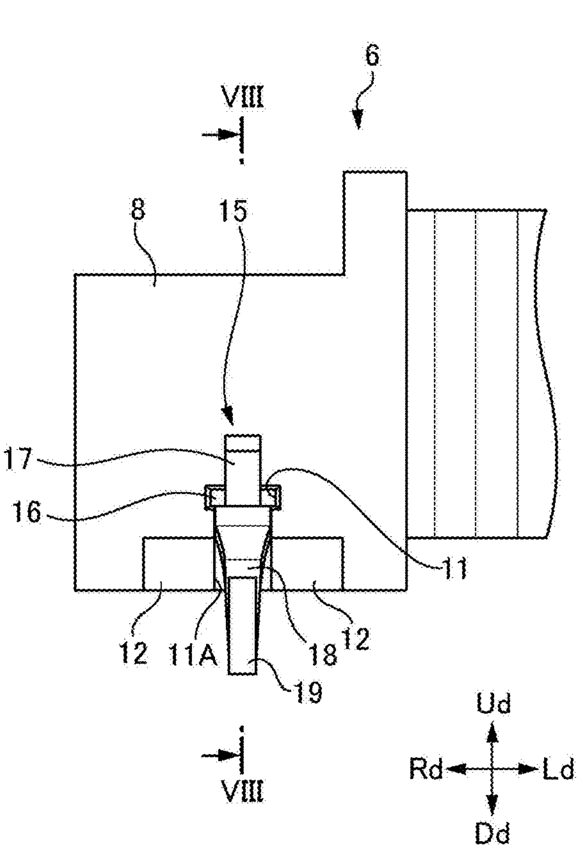
FIG. 7(A) is a rear external view of the right-hand portion of the bobbin used in the magnetic sensor of the magnetic sensor device according to the inventive embodiment.
FIG. 7(B) is a bottom external view of the right-hand portion of the bobbin used in said magnetic sensor.
Figure 7:
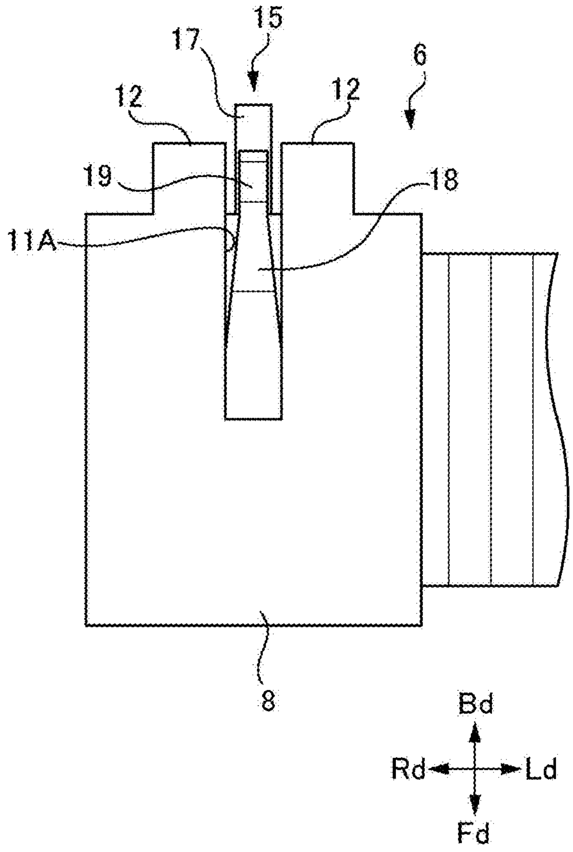

FIG. 3 is a lateral top perspective view of the magnetic sensor device 3 before mounting to the substrate 31, and the substrate 31. FIG. 4 is a bottom view of the magnetic sensor device 3.

The magnetic sensor device 3 comprises three magnetic sensors 4, three yokes 21, and one casing 22. The magnetic sensor device 3 is obtained by integrating the three magnetic sensors 4 and the three yokes 21 through the medium of the casing 22. As shown in FIG. 3, the three magnetic sensors 4 and the three yokes 21 are accommodated and secured within the casing 22. Specifically, as shown in FIG. 4, the three magnetic sensors 4 are attached within three sensor receiving holes 25 provided in the lower face of the casing 22. In addition, the three yokes 21 are incorporated into the casing 22. The three magnetic sensors 4 and the three yokes 21 are disposed at predetermined locations within the casing 22. In addition, the three magnetic sensors 4 are identical to one another. Furthermore, the three yokes 21 are identical to one another.

(Magnetic Sensors and Yokes)

The magnetic sensors 4 and yokes 21 will now be described. For ease of discussion, the directions associated with the magnetic sensors 4 and yokes 21, such as forward (Fd), back (Bd), up (Ud), down (Dd), left (Ld), and right (Rd), are defined as indicated by the arrows drawn at the bottom right of FIGS. 5-10, 13.

FIG. 5(A) is a rear, top, right view of one of the three magnetic sensors 4. FIG. 5(B) is a rear, top, right view of the bobbin 6 of the magnetic sensor 4.

In the magnetic sensor device 3, the magnetic sensors 4 are the sections that perform the sensing of the aforementioned rotating magnetic field. As shown in FIG. 5(A), the magnetic sensor 4 comprises a magnetic wire rod 5, a bobbin 6, a coil 13, and two terminals 15.

The magnetic wire rod 5, which is a magnetic wire rod that generates a large Barkhausen effect, is called a composite magnetic wire. The magnetic wire rod 5 is a wire rod formed, for example, from a semi-rigid magnetic material containing iron and cobalt, and having a diameter of, for example, approximately 0.1 mm to 1 mm, and a length of, for example, approximately 10 mm to 30 mm. The magnetic wire rod 5 is formed, for example, by drawing the above-mentioned semi-rigid magnetic material and twisting it multiple times while changing the direction. The magnetic wire rod 5 possesses uniaxial anisotropy, in which the direction of easy magnetization is the direction of the central axis of said magnetic wire rod 5. In addition, the coercivity of the magnetic wire rod 5 is higher in the central section than in the outer peripheral section thereof. The magnetic wire rod 5 has a property whereby the direction of magnetization of the magnetic wire rod 5 (the outer peripheral section thereof) is abruptly reversed in response to changes in the direction of an external magnetic field.

The bobbin 6 is formed, for example, from a plastics material or another nonmagnetic material. The bobbin 6 is bilaterally symmetrical in shape. As shown in FIG. 5(B), the bobbin 6 comprises a wire winding portion 7, two wire rod supporting portions 8, two flange portions 9, and a wire rod receiving groove 10. The wire winding portion 7, which is provided in the intermediate portion of the bobbin 6 in the left-to-right direction, is formed in a cylindrical configuration extending in the left-to-right direction. The wire rod supporting portions 8 are respectively provided at the left and right ends of the bobbin 6. The flange portions 9 are respectively provided between the wire winding portion 7 and the left wire rod supporting portion 8, and between the wire winding portion 7 and the right wire rod supporting portion 8. Each flange portion 9 is of a larger diameter than the wire winding portion 7. The wire rod receiving groove 10 is a groove that extends from the left end to the right end of the bobbin 6.

The magnetic wire rod 5 is disposed inside the bobbin 6 so as to extend rectilinearly in the left-to-right direction. Specifically, the magnetic wire rod 5 is disposed within the wire rod receiving groove 10. The left end portion of the magnetic wire rod 5 is supported (secured) by the left end portion of the wire rod receiving groove 10 formed in the left wire rod supporting portion 8 by bonding using adhesives and other means. Likewise, the right end portion of the magnetic wire rod 5 is supported (secured) by the right end portion of the wire rod receiving groove 10 formed in the right wire rod supporting portion 8. It should be noted that a wire rod receiving hole, i.e., a hole extending from the left end to the right end of the bobbin 6, may be provided instead of the wire rod receiving groove 10, and the magnetic wire rod 5 may be disposed within the wire rod receiving hole.

The coil 13 is provided at the outer periphery of the magnetic wire rod 5 disposed within the wire rod receiving groove 10. Specifically, as shown in FIG. 5(A), the coil 13 is formed by winding an insulated electric wire 14, for example an enameled wire, etc., around the wire winding portion 7.

Figure 8:
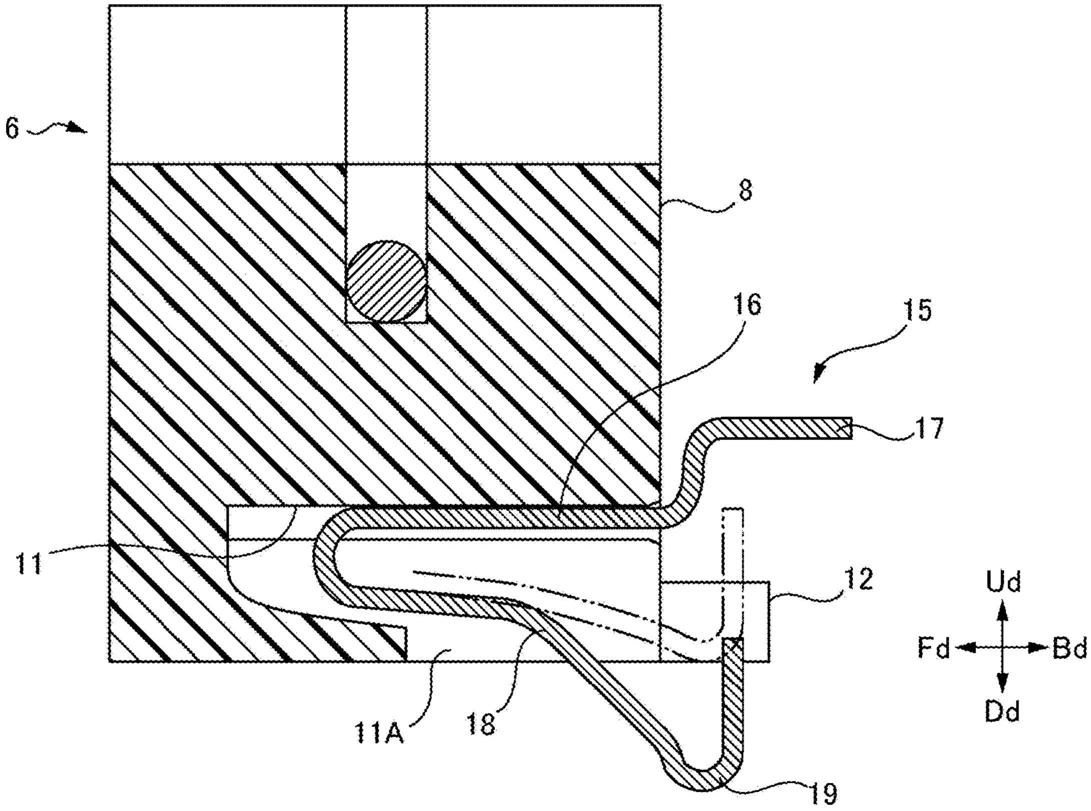
FIG. 8 a right-side cross-sectional view of the right-hand portion of the bobbin and a terminal taken along section line VIII-VIII in FIG. 7(A).

FIG. 6 illustrates a terminal 15. FIG. 7(A) illustrates the right-hand wire rod supporting portion 8 of the bobbin 6 as viewed from the rear. FIG. 7(B) illustrates the right-hand wire rod supporting portion 8 of the bobbin 6 as viewed from the bottom. FIG. 8 illustrates a cross-section of the wire rod supporting portion 8 and the terminal 15 taken along section line VIII-VIII in FIG. 7(A), as viewed from the right (from the left in FIG. 7(A)).

As shown in FIG. 6, each terminal 15 is a compression terminal. It should be noted that compression terminals are sometimes referred to as "spring terminals." Each terminal 15 is formed from an electrically conductive material, for example a metallic material. Each terminal 15 comprises a base portion 16, an electrical wire connecting portion 17, a spring portion 18, and a contact portion 19.

The base portion 16, which expands in the forward-backward and left-to-right direction, is formed in the shape of a plate elongated in the forward-backward direction. The electrical wire connecting portion 17 is a section that is connected to an end of the insulated electrical wire 14 of the coil 13 stripped of its insulating jacket. While not depicted in the drawings, the electrical wire connecting portion 17 of one terminal 15 of the two terminals 15 is connected to one end of the insulated electrical wire 14, and the electrical wire connecting portion 17 of the other terminal 15 is connected to the other end of the insulated electrical wire 14. After extending slightly rearward from the rear end portion of the base portion 16, the electrical wire connecting portion 17 is bent upward and, after extending upward, is bent rearward and then extends rearward. The spring portion 18 is a flat spring intended for displacing the contact portion 19 in the up-down direction. After bending downward from the front end portion of the base portion 16, the spring portion 18 is subsequently bent rearward and then extends rearward while sloping downward. The contact portion 19 is a section that makes contact with a conductor portion 34 (for example a pad) provided on the substrate 31 once the magnetic sensor device 3 is secured to the substrate 31. The contact portion 19 is provided at the lowermost as well as the rearmost end of the spring portion 18. In addition, after bending upward from said end of the spring portion 18, the contact portion 19 extends slightly upward.

As shown in FIG. 5(A), the two terminals 15 are respectively provided in the bottom portions of the two wire rod supporting portions 8 of the bobbin 6. Specifically, as shown in FIG. 8, a terminal securing portion 11 is provided in the bottom portion of the right-hand wire rod supporting portion 8 of the bobbin 6. In addition, in a manner similar to the bottom portion of the right-hand wire rod supporting portion 8 of the bobbin 6, a terminal securing portion 11 is also provided in the bottom portion of the left-hand wire rod supporting portion 8 of the bobbin 6. The two terminals 15 are respectively secured to these terminal securing portions 11. In the present embodiment, the terminal securing portions 11 are holes extending forwardly from the rear face of the bottom portion of each wire rod supporting portion 8, with the rear end portion thereof being open, and the front end portion sealed. In addition, a notch 11A is formed in the rear bottom portion of the terminal securing portion 11. The terminals 15 are secured to the bottom portions of the wire rod supporting portions 8 by inserting the base portion 16 into the terminal securing portion 11 from the rear. In addition, as shown in FIG. 6, engagement protrusions 20 are respectively provided at the left and right ends of the base portion 16, and the base portion 16 is retained against removal from the terminal securing portion 11 by the engagement of these engagement protrusions 20 with the left and right interior surfaces, respectively, of the terminal securing portion 11.

As shown in FIG. 8, once the base portions 16 of the terminals 15 are secured within the terminal securing portions 11, the electrical wire connecting portions 17 protrude rearwardly of the rear faces of the wire rod supporting portions 8. In addition, when the magnetic sensor device 3 is spaced apart from the substrate 31, the front end portions of the spring portions 18 are positioned within the terminal securing portions 11, but the rear portions of the spring portions 18 come out of the terminal securing portions 11 through the notches 11A and protrude downwardly of the lower faces of the wire rod supporting portions 8. In addition, when the magnetic sensor device 3 is spaced apart from the substrate 31, the contact portions 19 are positioned downwardly of the lower faces of the wire rod supporting portions 8. On the other hand, when the magnetic sensor device 3 is secured to the substrate 31, the contact portions 19 are pushed by the top faces of the conductor portions 34 provided on the substrate 31 and are displaced upward against the resilient force of the spring portions 18 as shown with a two-dot chain line in FIG. 8. As a result, the position of the bottom end portions of the contact portions 19 in the up-down direction coincides with the position of the lower faces of the wire rod supporting portions 8. At such time, the contact portions 19 are pressed against the conductor portions 34 by the resilient force of the spring portions 18 and make strong contact with the conductor portions 34. This ensures that the contact portions 19 are electrically connected to the conductor portions 34.

In addition, as shown in FIG. 7(B), two guard portions 12 are provided in the bottom portion of the rear face of each wire rod supporting portion 8 of the bobbin 6. The two guard portions 12 protrude rearward and are aligned side-by-side while being spaced apart in the left-to-right direction. The top end portions of the contact portions 19 of the terminals 15 are disposed between the two guard portions 12. In this manner, the contact portions 19 are protected by the guard portions 12. The guard portions 12 minimize the misalignment of the contact portions 19 to the left or to the right.

Figure 9:
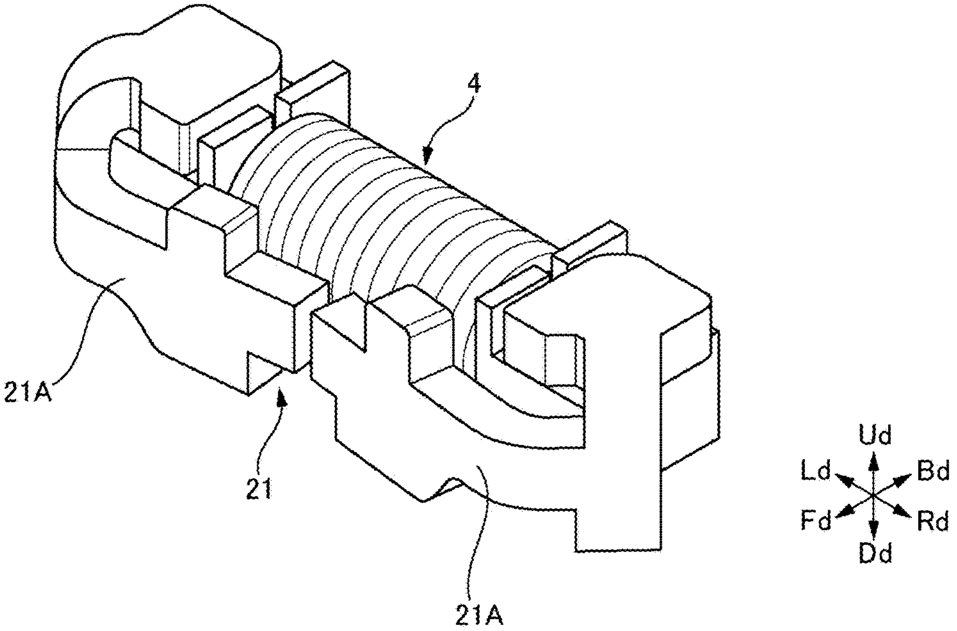
FIG. 9 a front, top, right perspective view of the magnetic sensor and a yoke used in the magnetic sensor device according to the inventive embodiment.

FIG. 9 is a front, top, right view of a magnetic sensor 4 and a yoke 21 corresponding to said magnetic sensor 4. The yoke 21 has the function of controlling the direction of the magnetic flux of an external magnetic field. Specifically, the yoke 21 controls the direction of the magnetic flux of the magnetic field formed by the magnetic field forming portion 2. As shown in FIG. 9, the yoke 21 comprises two yoke pieces 21A. Each yoke piece 21A is formed, for example, from iron or another soft magnetic material. A portion of one yoke piece 21A is disposed in front of the left-hand portion of the magnetic sensor 4, and another portion of said one yoke piece 21A is disposed above the left end portion of the magnetic sensor 4. In addition, a portion of the other yoke piece 21A is disposed in front of the right-hand portion of the magnetic sensor 4, and another portion of the other yoke piece 21A is disposed above the right end portion of the magnetic sensor 4.

(Casing)

The casing 22 is formed, for example, from a plastics material or another nonmagnetic material. As shown in FIG. 3, the casing 22 has a structure that couples three sensor holding portions 23 through the medium of a coupling portion 24. As shown in FIG. 4, one magnetic sensor 4 and one yoke 21 are accommodated and secured in each sensor holding portion 23. The shapes of the three sensor holding portions 23 are identical to one another.

Figure 10:
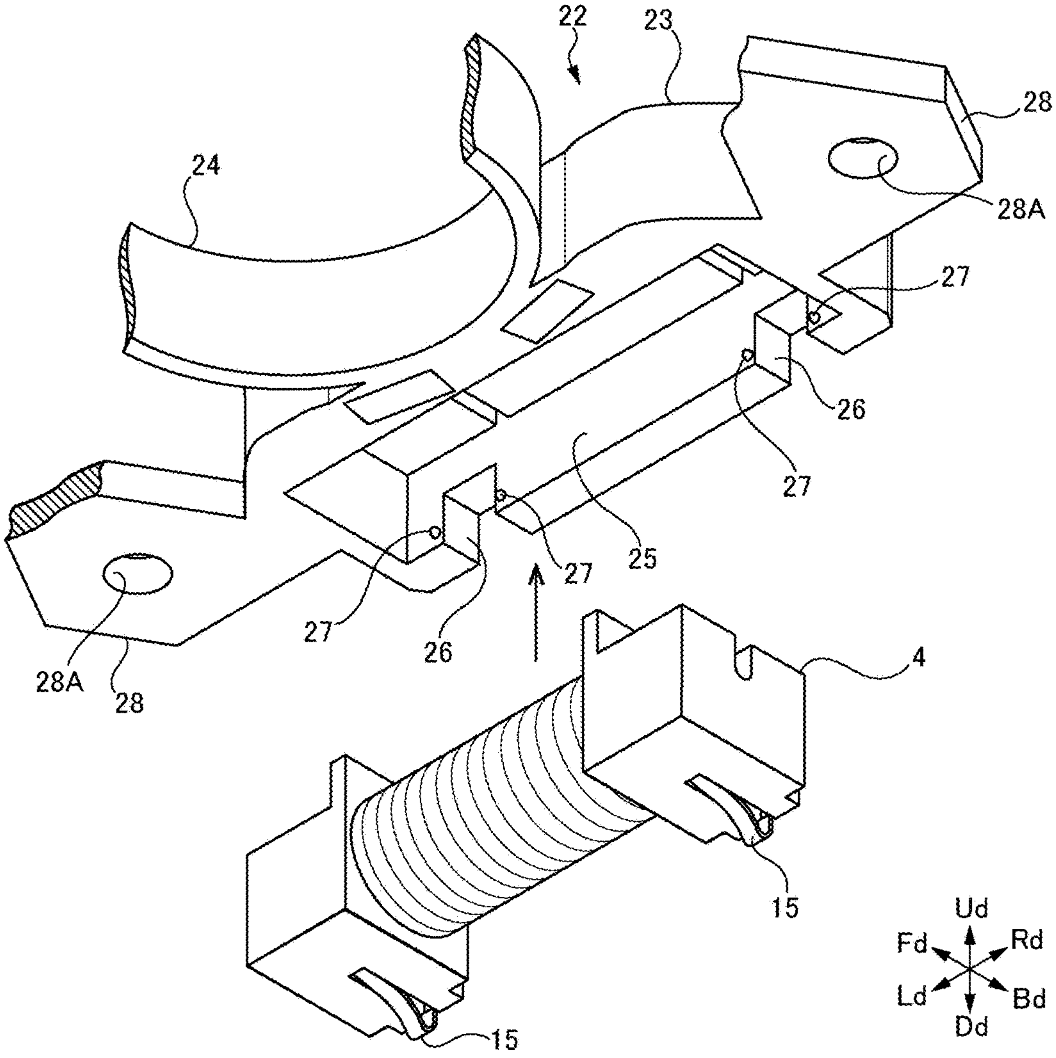
FIG. 10 is an illustrative view of a method for attaching a magnetic sensor to the casing in the magnetic sensor device according to the inventive embodiment.

FIG. 10 is a lateral bottom perspective view of one sensor holding portion 23 in the casing 22. For ease of discussion, the directions associated with the sensor holding portions 23, such as forward (Fd), back (Bd), up (Ud), down (Dd), left (Ld), and right (Rd), are defined as indicated by the arrows drawn at the bottom right of FIG. 10.

As shown in FIG. 10, a sensor receiving hole 25 is formed in the sensor holding portion 23. The magnetic sensor 4 is received within the sensor receiving hole 25. The sensor receiving hole 25, which is formed in the lower face of the sensor holding portion 23, is downwardly open and has its top portion sealed. The shape of the opening of the sensor receiving hole 25 is a rectangle corresponding to the outer shape and size of the magnetic sensor 4 in such a manner that the magnetic sensor 4 is snugly inserted into the sensor receiving hole 25. The dimensions of the sensor receiving hole 25 in the left-to-right direction are substantially equal to the dimensions of the magnetic sensor 4 in the left-to-right direction, and the dimensions of the sensor receiving hole 25 in the forward-backward direction are substantially equal to the dimensions of the section obtained by subtracting the guard portions 12 from each wire rod supporting portion 8 of the bobbin 6 of the magnetic sensor 4 in the forward-backward direction.

In addition, notches 26 are respectively formed in the left and right rear portions of the sensor holding portions 23. Upon insertion of the magnetic sensor 4 into the sensor receiving hole 25, a portion of the terminal 15 and the two guard portions 12 provided in the rear portion of the left wire rod supporting portion 8 of the bobbin 6 of the magnetic sensor 4 is disposed inside the left notch 26, whereas a portion of the terminal 15 and the two guard portions 12 provided in the rear portion of the right wire rod supporting portion 8 of the bobbin 6 of the magnetic sensor 4 is disposed inside the right notch 26.

In addition, a plurality of forwardly protruding projections 27 are formed on the rear face of the sensor receiving hole 25. Upon insertion of the magnetic sensor 4 into the sensor receiving hole 25, each projection 27 presses hard against the bobbin 6. This secures the magnetic sensor 4 in the sensor receiving hole 25. When installing the magnetic sensor 4 in the sensor holding portion 23, the operator press-fits the magnetic sensor 4 into the sensor receiving hole 25. In addition, once the magnetic sensor 4 is installed in the sensor holding portion 23 by inserting the magnetic sensor 4 deep into the sensor receiving hole 25, the lower face of the bobbin 6 of the magnetic sensor 4 (the lower face of each wire rod supporting portion 8) is disposed coplanar with the lower face of the sensor holding portion 23, i.e., the lower face of the casing 22.

In addition, in the present embodiment, the three yokes 21 are integrated with the casing 22 by insert molding. As shown in FIG. 4, the three yokes 21 are incorporated into three sensor holding portions 23. In addition, in each sensor holding portion 23, the yoke 21 is positioned in front of the sensor receiving hole 25.

As shown in FIG. 3, the three sensor holding portions 23 have their front portions integrated by coupling using the coupling portion 24. In addition, the lower faces of the three sensor holding portions 23 are disposed so as to be positioned within the same plane. In addition, when the casing 22 is viewed from above, the three sensor holding portions 23 are disposed at 120-degree intervals about the reference line Q with the reference line Q located at the center. In addition, the three sensor holding portions 23 are disposed in such a manner that the front portions thereof are respectively facing toward the reference line Q. In addition, the three sensor holding portions 23 are disposed in such a manner that the sensor holding portions 23 are respectively equidistant from the reference line Q. In addition, when viewed from above, the casing 22 is shaped to have rotational symmetry (three-fold symmetry) about the reference line Q.

In addition, the coupling portion 24 is formed in a cylindrical configuration and the center of the coupling portion 24 is positioned on the reference line Q. In addition, the inside diameter of the coupling portion 24 is set to a value greater than the outside diameter of the magnetic field forming member 2. In addition, in the present embodiment, the diameter of the shaft insertion hole 32 in the substrate 31 is set to a value greater than the outside diameter of the magnetic field forming member 2, and the inside diameter of the coupling portion 24 is set to the same value as the diameter of the shaft insertion hole 32 (see FIGS. 1 and 2).

In addition, as shown in FIG. 3, a plurality of sensor securing portions 28 used for securing the casing 22 (magnetic sensor device 3) to the substrate 31 with fasteners are provided in the casing 22. In the present embodiment, the fasteners are bolts 29 and nuts 30. In the casing 22 of the present embodiment, the three sensor securing portions 28 are disposed in the outer peripheral section of the casing 22 at 120-degree intervals about the reference line Q, with the reference line Q located as the center. Each sensor securing portion 28 is disposed between two sensor holding portions 23 adjacent in the circumferential direction. Each sensor securing portion 28 is formed in the shape of a plate and is integrated with two adjacent sensor holding portions 23. In addition, as shown in FIG. 4, the lower face of each sensor securing portion 28 is coplanar with the lower face of the three sensor holding portions 23 (the lower face of the casing 22).

In addition, a bolt insertion hole 28A is provided in each sensor securing portion 28. In addition, as shown in FIG. 3, the same number of sensor securing holes 33 as the number of the sensor securing portions 28 (i.e., three) are provided in the outer peripheral section of the substrate 31. The position of the three sensor securing holes 33 in the substrate 31 is set to coincide with the positions of the bolt insertion holes 28A of the three sensor securing portions 28 when the casing 22 and the substrate 31 are disposed in such a manner that the center of the casing 22 (the position through which the reference line Q passes) and the center of the shaft insertion hole 32 of the substrate 31 coincide.

The magnetic sensor device 3 is secured to the substrate 31 by inserting a bolt 29 into the bolt insertion hole 28A of each sensor securing portion 28 and into the sensor securing hole 33 corresponding thereto and tightening a nut 30 on the distal end portion of each bolt 29. In addition, in order to enable adjustment of the position of the magnetic sensor device 3 relative to the substrate 31, the diameter of each sensor securing hole 33 is set to a value that is slightly larger than the diameter of the shaft portion of the bolts 29.

(Placement of Magnetic Sensors, Etc., within Casing)

Figure 11:
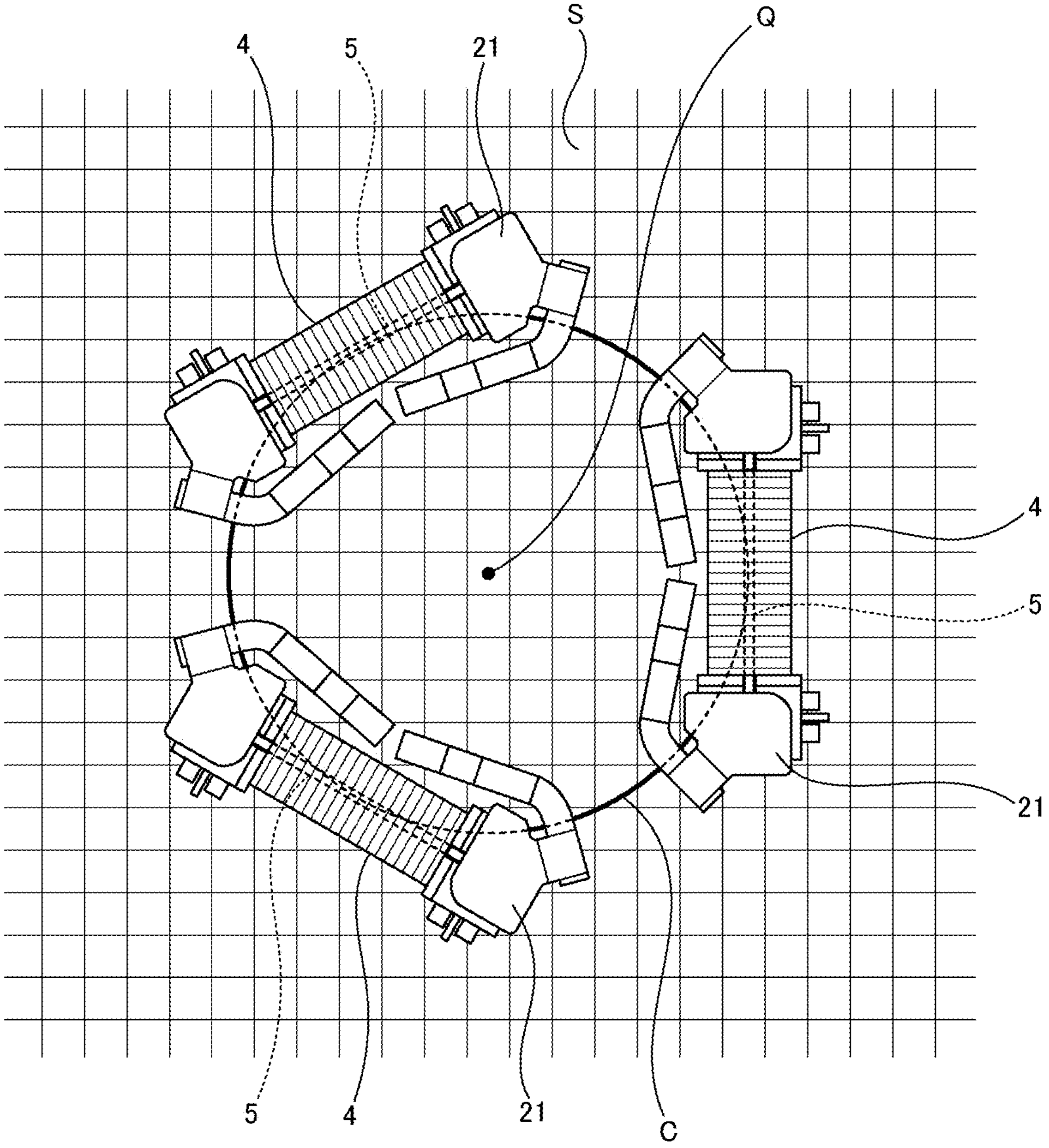
FIG. 11 is an illustrative view of the placement of the magnetic sensors and yokes within the casing of the magnetic sensor device according to the inventive embodiment.
Figure 12:
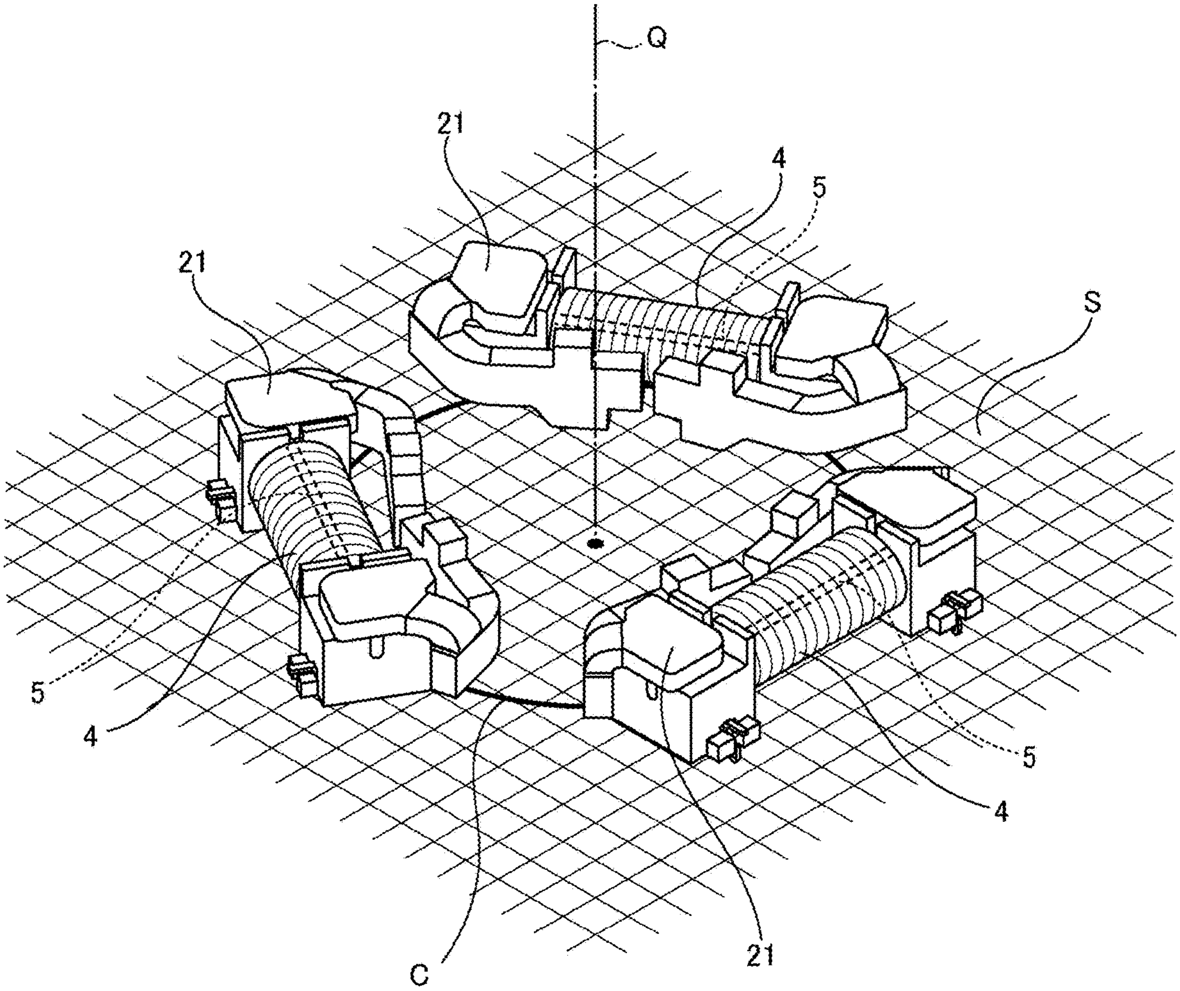
FIG. 12 is an illustrative view of the placement of the magnetic sensors and yokes within the casing of the magnetic sensor device according to the inventive embodiment.

FIG. 11 is a top view of the placement of the three magnetic sensors 4 and the three yokes 21 in the casing 22. FIG. 12 is a lateral top perspective view of the placement of the three magnetic sensors 4 and the three yokes 21 in the casing 22. In FIG. 11 and FIG. 12, "S" is a reference plane positioned coplanar with the lower face of the casing 22. For convenience of illustration, the reference plane S has a grid pattern applied thereto.

As shown in FIGS. 11 and 12, within the casing 22, the three magnetic sensors 4 are disposed on the reference plane S, which is positioned coplanar with the lower face of the casing 22. Specifically, the lower face of each wire rod supporting portion 8 of the bobbin 6 of each magnetic sensor 4 is placed on the reference plane S. In addition, within the casing 22, the three magnetic sensors 4 are disposed at 120-degree intervals about the reference line Q perpendicular to the reference plane S. In addition, within the casing 22, the three magnetic sensors 4 are disposed in such a manner that the directions of extension of the magnetic wire rods 5 are parallel to the reference plane S. In addition, in the present embodiment, the three magnetic sensors 4 are disposed within the casing 22 in such a manner that when the casing 22 is viewed from above, the central parts of the magnetic wire rods 5 in the direction of extension (strictly speaking, the central parts of the central axes of the magnetic wire rods 5 in the direction of extension) are tangential to a reference circle C. The reference circle C is a circle drawn on the reference plane S, with the center thereof located on the reference line Q. The three magnetic sensors 4 are disposed such that the front portions thereof are facing toward the reference line Q and, in addition, the magnetic sensors 4 are respectively equidistant from the reference line Q. The three magnetic sensors 4 are disposed in this manner when the three magnetic sensors 4 are installed in the three sensor receiving holes 25 of the casing 22.

In addition, within the casing 22, the three yokes are disposed to lie adjacent to the three respective magnetic sensors 4 at the inner periphery of the three magnetic sensors 4 disposed about the reference line Q. Specifically, the three yokes 21 are disposed on the reference plane S at 120-degree intervals in such a manner that the front portions thereof are facing toward the reference line Q and the yokes 21 are respectively equidistant from the reference line Q. The three yokes 21 are incorporated into the casing 22 so as to obtain such a placement.

(Assembly of Substrate and Magnetic Sensor Device)

The method used to assemble the substrate 31 and the magnetic sensor device 3 with the housing 41 of the motor in order to form the rotation sensing device 1 is as follows.

First, electrical and electronic components other than the magnetic sensor device 3 are soldered to the mounting face 31A, etc., of the substrate 31.

Next, the substrate 31, to which the electrical and electronic components other than the magnetic sensor device 3 have been soldered, is disposed at the outer periphery of the rotary shaft 40. At such time, the substrate 31 is disposed in such a manner that the center of the shaft insertion hole 32 of the substrate 31 coincides with the center of rotation of the rotary shaft 40. The substrate 31 is then secured to the housing 41 of the motor by attaching it with brackets 42.

Next, the magnetic sensor device 3, in which the three yokes 21 are incorporated into the casing 22 and the three magnetic sensors 4 are respectively accommodated in the three sensor receiving holes 25 of the casing 22, is attached and secured to the mounting face 31A of the substrate 31.

When the magnetic sensor device 3 is attached and secured to the mounting face 31A of the substrate 31, first the position of the magnetic sensor device 3 relative to the rotary shaft 40 is determined. Specifically, the lower face of the casing 22 and the mounting face 31A of the substrate 31 are placed in opposition such that these faces are parallel, and the position of the magnetic sensor device 3 is determined in such a manner that the reference line Q in the casing 22 coincides with the axis of rotation X of the rotary shaft 40. In addition, at such time, the position of the magnetic sensor device 3 is determined in such a manner that the positions of the bolt insertion holes 28A of the three sensor securing portions 28 of the casing 22 coincide with the positions of the three sensor securing holes 33 in the substrate 31. Such positioning can be readily done with the help of, for example, a positioning device comprising imaging means and image processing means, or a dedicated jig and the like.

Figure 13:
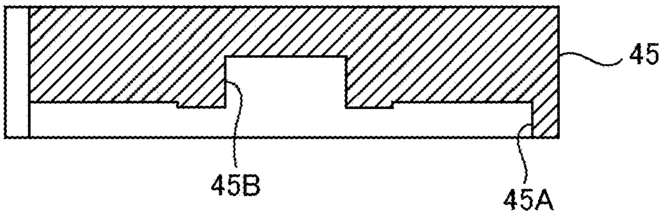
FIGS. 13(A) to 13(D) are illustrative views of a method for positioning the magnetic sensor device according to the inventive embodiment.
Figure 13:
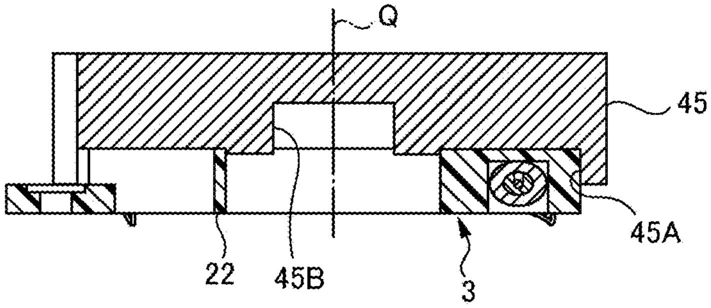
Figure 13:
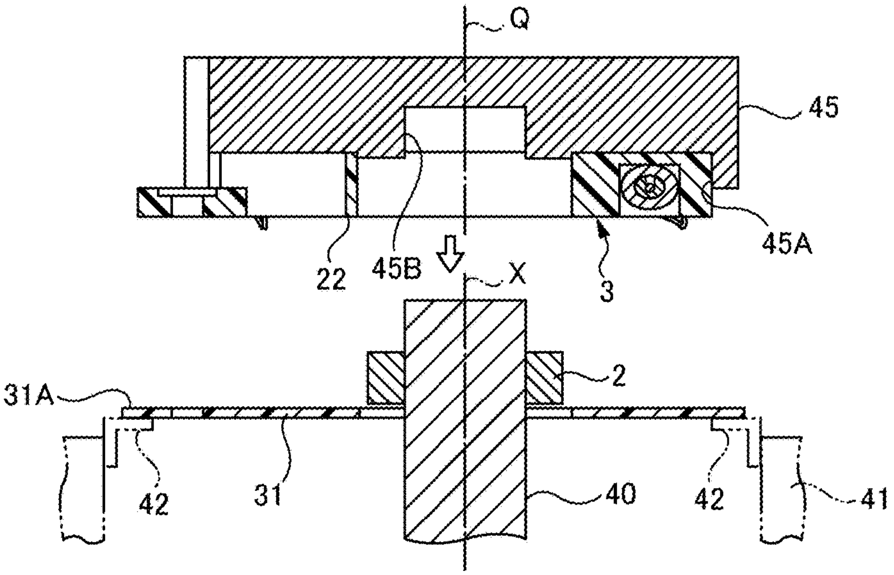
Figure 13:
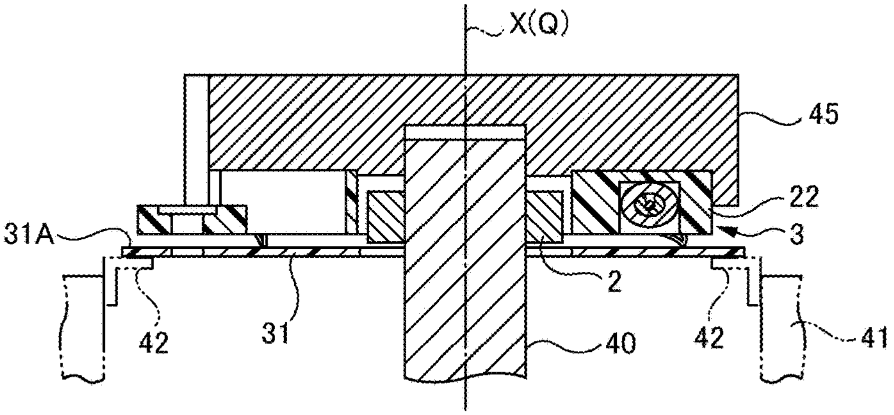

FIGS. 13(A-D) illustrate a method for positioning the magnetic sensor device 3 with the help of a dedicated jig. As shown in FIG. 13(A), the jig 45 is fabricated for the purpose of positioning magnetic sensor device 3. Recess portions 45A, 45B, which are made to imitate the outer shapes of the respective top portions of the rotary shaft 40 and the magnetic sensor device 3 disposed such that the reference line Q in the casing 22 and the axis of rotation X of the rotary shaft 40 coincide, are formed in the lower face of the jig 45. As shown in FIG. 13(B), when performing the aforementioned positioning, the top portion of the magnetic sensor device 3 is inserted into the recess portion 45A of the jig 45. As shown in FIGS. 13(C) and 13(D), the jig 45 into which the top portion of the magnetic sensor device 3 has been inserted is placed onto the top end portion of the rotary shaft 40 from above the rotary shaft 40. The recess portion 45B of the jig 45 is made to imitate the top end portion of the rotary shaft 40, and placing the jig 45 onto the top end portion of the rotary shaft 40 makes it possible for the top end portion of the rotary shaft 40 to be snugly inserted into the recess portion 45B, thereby setting the position of the jig 45 relative to the rotary shaft 40. This determines the position of the magnetic sensor device 3 inserted into the jig 45 relative to the rotary shaft 40.

After positioning the magnetic sensor device 3, a bolt 29 is inserted into the bolt insertion hole 28A of each sensor securing portion 28 and the sensor securing hole 33 corresponding thereto, and a nut 30 is tightened on the distal end portion of each bolt 29. Tightening the nut 30 on each bolt 29 secures the magnetic sensor device 3 to the mounting face 31A of the substrate 31, as a result of which the three magnetic sensors 4 and the three yokes 21 are secured to the mounting face 31A of the substrate 31. In this state, the lower face of the casing 22 is in contact with the mounting face 31A of the substrate 31. Furthermore, the lower face of each wire rod supporting portion 8 of the bobbin 6 of each magnetic sensor 4 is in contact with the mounting face 31A of the substrate 31. In addition, the contact portion 19 of each terminal 15 of each magnetic sensor 4 makes contact with a conductor portion 34 on the substrate 31, the contact portion 19 is pressed against the conductor portion 34, the spring portion 18 is resiliently deformed, and the contact portion 19 is displaced upward. As a result, the contact portion 19 pushes hard against the conductor portion 34 and the contact portion 19 is reliably electrically connected to the conductor portion 34.

As shown in FIGS. 1 and 2, mounting the casing 22 to the mounting face 31A of the substrate 31 in this manner allows for the magnetic field forming member 2 to be disposed inside the coupling portion 24 of the casing 22 while remaining free of contact with the coupling portion 24. Furthermore, the position of the reference plane S shown in FIG. 11 coincides with the position of the mounting face 31A, and the three magnetic sensors 4, along with the three yokes 21, are disposed at the outer periphery of the magnetic field forming member 2 on the mounting face 31A of the substrate 31 while maintaining their positional relationship formed on the reference plane S. Specifically, the three magnetic sensors 4 are disposed on the mounting face 31A of the substrate 31 as shown in FIGS. 1 and 2. The three magnetic sensors 4 are disposed at the outer periphery of the magnetic field forming member 2 at 120-degree intervals in the direction of rotation of the magnetic field forming member 2. In addition, each magnetic sensor 4 is disposed in such a manner that the direction of extension of the magnetic wire rod 5 is parallel to the mounting face 31A of the substrate 31. In addition, when the mounting face 31A of the substrate 31 is viewed from above, each magnetic sensor 4 is disposed in such a manner that the central part of the magnetic wire rod 5 in the direction of extension (strictly speaking, the central part of the central axis of the magnetic wire rod 5 in the direction of extension) is tangential to the circle D centered on the center of rotation of the rotary shaft 40, which is drawn at the outer periphery of the magnetic field forming member 2. When the mounting face 31A of the substrate 31 on which the casing 22 is mounted is viewed from above, this circle D overlaps with the reference circle C. In addition, the three yokes 21 are disposed on the mounting face 31A of the substrate 31. The three yokes 21 are disposed at the outer periphery of the magnetic field forming member 2 at 120-degree intervals in the direction of rotation of the magnetic field forming member 2. In addition, each yoke 21 is disposed to lie adjacent to a magnetic sensor 4, at the inner periphery of the magnetic sensor 4. In this manner, the predetermined positional relationship of the magnetic field forming member 2, three magnetic sensors 4, and three yokes 21 used for sensing the rotation of the rotary shaft 40 is conclusively determined simply by mounting the casing 22 to the mounting face 31A of the substrate 31.

(Magnetic Field Sensing Operation of Magnetic Sensors, etc.)

Figure 14:
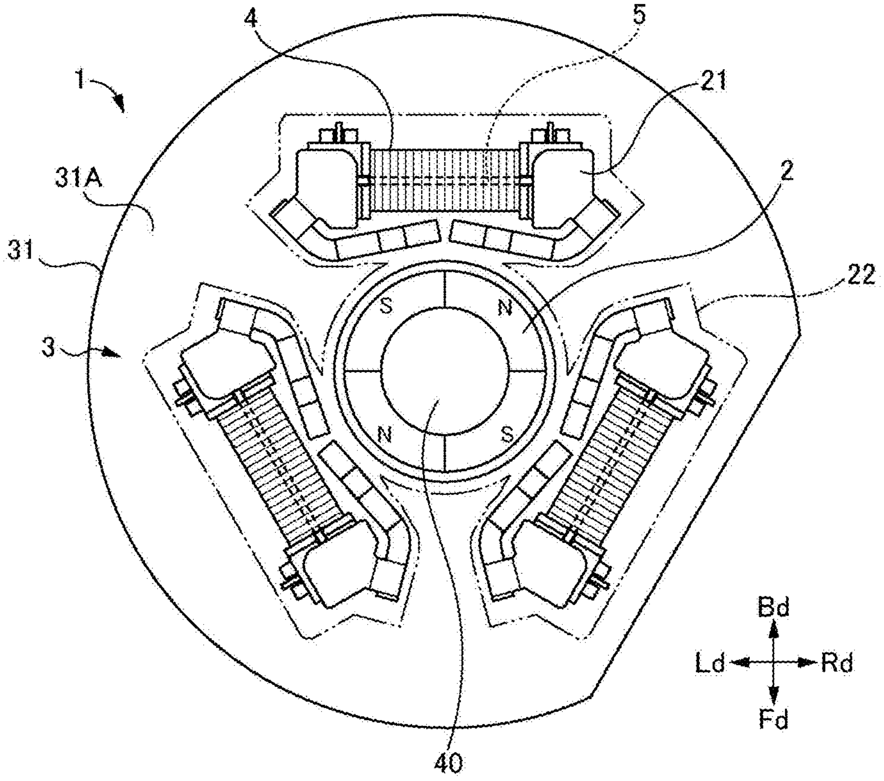
FIGS. 14(A) to 14(D) are illustrative views of the magnetic field sensing operation of the magnetic sensors, etc., in the magnetic sensor device according to the inventive embodiment.
Figure 14:
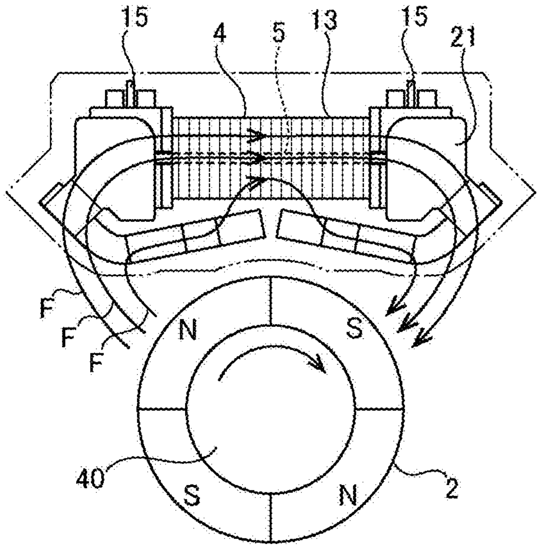
Figure 14:
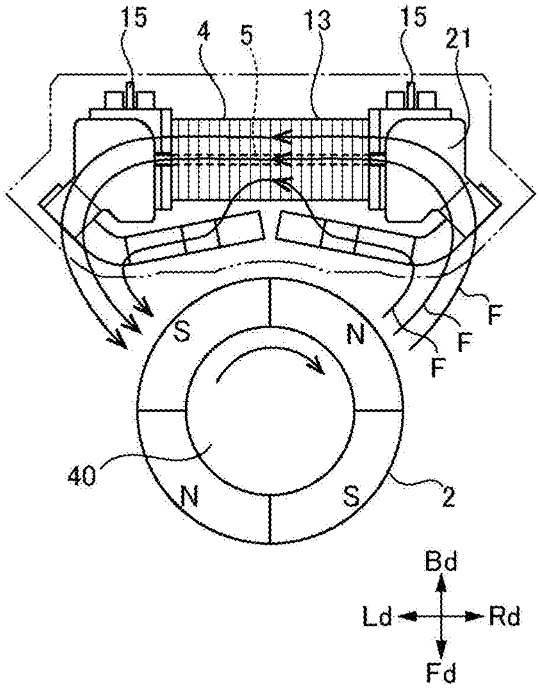
Figure 14:
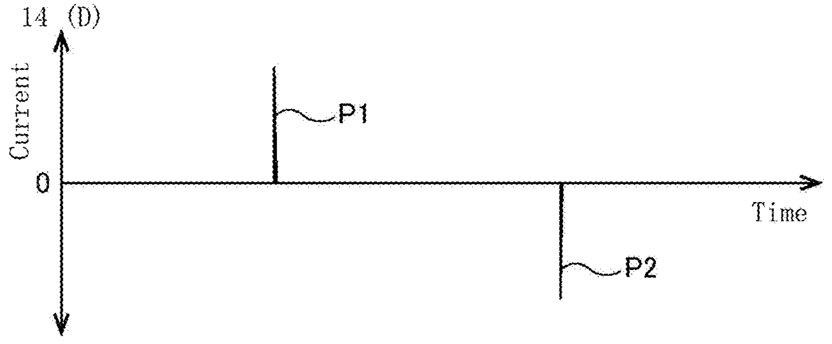

FIG. 14(A) illustrates the positional relationship of the magnetic field forming member 2, three magnetic sensors 4, and three yokes 21 obtained when the magnetic sensor device 3 is provided on the substrate 31. The magnetic field sensing operation of the magnetic sensors 4 and the yokes 21 will be described below by focusing on the magnetic sensor 4 and the yoke 21 located at the top among the three magnetic sensors 4 and three yokes 21 in FIG. 14(A).

In FIG. 14(A), an S pole of the magnetic field forming member 2 has approached the left front of the magnetic sensor 4 at the top, and an N pole of the magnetic field forming member 2 has approached the right front of said magnetic sensor 4. As shown in FIG. 14(B), if the rotary shaft 40 rotates 90 degrees clockwise in this state, an N pole of the magnetic field forming member 2 will approach the left front of said magnetic sensor 4, and an S pole of the magnetic field forming member 2 will approach the right front of said magnetic sensor 4. At such time, the direction of the magnetic field acting on the magnetic wire rod 5 of said magnetic sensor 4 will be to the right. This causes the direction of magnetization of the magnetic wire rod 5, which was to the left immediately before that, to be abruptly reversed to the right. As a result, as shown in FIG. 14(D) for example, a positive-going current pulse P1 is generated in the coil 13.

Thereafter, as shown in FIG. 14(C), if the rotary shaft 40 rotates another 90 degrees clockwise, an S pole of the magnetic field forming member 2 will approach the left front of said magnetic sensor 4, and an N pole of the magnetic field forming member 2 will approach the right front of said magnetic sensor 4. At such time, the direction of the magnetic field acting on the magnetic wire rod 5 of said magnetic sensor 4 will be to the left. This causes the direction of magnetization of the magnetic wire rod 5, which was to the right immediately before that, to be abruptly reversed to the left. As a result, as shown in FIG. 14(D) for example, a negative-going current pulse P2 is generated in the coil 13.

One end of the insulated electrical wire 14 that forms the coil 13 is connected to a sensing circuit provided, for example, on the substrate 31, through the medium of one terminal 15 of the magnetic sensor 4 and one conductor portion 34 provided on the mounting face 31A of the substrate 31. In addition, the other end of the insulated electrical wire 14 that forms the coil 13 is connected to the aforementioned sensing circuit through the medium of the other terminal 15 of the magnetic sensor 4 and another conductor portion 34 provided on the mounting face 31A of the substrate 31. With such an arrangement, the current pulses P1, P2 generated in the coil 13 are output as pulse signals to the aforementioned sensing circuit.

The aforementioned sensing circuit senses the amount and direction of rotation, etc., of the rotary shaft 40 based on pulse signals respectively output from the coils 13 of the three magnetic sensors 4 disposed on the mounting face 31A of the substrate 31. It should be noted that, for example, the method described in International Publication No. 2016/002437 can be used as a method of sensing the amount and direction of rotation of the rotary shaft 40 in the rotation sensing device 1.

In addition, to increase the level of the current pulses generated in the coil 13 or to sharpen the waveform of the current pulses, it is desirable for the magnetic flux of the magnetic field formed by the two magnetic poles of the magnetic field forming member 2 approaching the left front and right front of the magnetic sensor 4 to be focused on the magnetic wire rod 5. As shown in FIG. 14(B) or FIG. 14(C), a yoke 21 is disposed between the magnetic sensor 4 and the magnetic field forming member 2. The yoke 21 controls the direction of the magnetic flux in such a manner that the magnetic flux of the magnetic field formed by the two magnetic poles of the magnetic field forming member 2 approaching the left and right front of the magnetic sensor 4 is focused on the magnetic wire rod 5. The arrows F in FIGS. 14(B) and 14(C) indicate the flow of the magnetic flux whose direction is controlled by the yoke 21. Since the magnetic flux is focused on the magnetic wire rod 5 by the yoke 21, the magnetic flux flows along the direction of extension of the magnetic wire rod 5 and, in addition, the magnetic flux reliably passes through the magnetic wire rod 5.

As described above, the magnetic sensor device 3 according to the inventive embodiment comprises a casing 22, in which three magnetic sensors 4 are secured at predetermined locations for sensing the rotation of the rotary shaft 40, and sensor securing portions 28 for securing the casing 22 to the substrate 31 with fasteners (bolts 29 and nuts 39), and, in addition, each terminal 15 of each magnetic sensor 4 is a compression terminal. When the rotation sensing device 1 is formed by assembling the substrate 31 and the magnetic sensor device 3 with the housing 41 of the motor, the thus-configured magnetic sensor device 3 allows for each magnetic sensor 4 to be readily placed on the substrate 31 in such a manner that the position of each magnetic sensor 4 relative to the rotary shaft 40 corresponds to the design position.

That is to say, each terminal 15 of each magnetic sensor 4 is a compression terminal, and as the casing 22 is secured to the substrate 31 by the sensor securing portions 28 and the fasteners, each terminal 15 is pressed against the respective conductor portion 34 on the substrate 31 and is electrically connected to the conductor portion 34. Therefore, no soldering is necessary for connecting each terminal 15 to a conductor portion 34. In addition, the fact that securing the casing 22 to the substrate 31 with the sensor securing portions 28 and the fasteners secures each magnetic sensor 4 to the substrate 31 also makes soldering unnecessary for securing the casing 22 and each magnetic sensor 4 to the substrate 31. In the prior art, the terminals of the magnetic sensors need to be soldered to the pads on the substrate and, therefore, upon mounting the magnetic sensors to the substrate by soldering them to the substrate, the substrate to which the magnetic sensors have been mounted must be assembled with the rotation sensing device. By contrast, in the inventive embodiment, no soldering is required to electrically connect each terminal 15 of each magnetic sensor 4 to the conductor portions 34 on the substrate 31 and no soldering is required to secure the casing 22 and each magnetic sensor 4 to the substrate 31, which makes it possible to assemble the housing 41 of the motor with the substrate 31 without the magnetic sensor device 3 mounted thereon. For this reason, in the inventive embodiment, the magnetic sensor device 3 can be mounted to the substrate 31 after assembling the substrate 31 with the housing 41 of the motor and, furthermore, the positioning of the magnetic sensor device 3 relative to the rotary shaft 40 can be performed when mounting the magnetic sensor device 3 to the substrate 31. According to the inventive embodiment, there will be no deviation from the design position of the casing 22 and each magnetic sensor 4 relative to the substrate 31 during soldering because neither the casing 22 nor any magnetic sensor 4 is soldered to the substrate 31. In addition, due to the fact that, according to the inventive embodiment, the magnetic sensor device 3 is mounted to the substrate 31 after assembling the substrate 31 with the housing 41 of the motor and the positioning of the magnetic sensor device 3 relative to the rotary shaft 40 is performed when the magnetic sensor device 3 is mounted to the substrate 31, even if the substrate 31 is misaligned relative to the housing 41 when the substrate 31 is assembled with the housing 41 of the motor, the misalignment of the substrate 31 relative to the housing 41 can be absorbed by adjusting the position of the magnetic sensor device 3 relative to the substrate 31 when the magnetic sensor device 3 is mounted to the substrate 31. That is, even if the substrate 31 is misaligned relative to the housing 41, the magnetic sensor device 3 can be disposed such that the position of the magnetic sensor device 3 relative to the rotary shaft 40 corresponds to the design position. In other words, even if the substrate 31 is misaligned relative to the housing 41, each magnetic sensor 4 can be disposed such that the position of each magnetic sensor 4 relative to the rotary shaft 40 corresponds to the design position.

In addition, with the magnetic sensor device 3 according to the inventive embodiment, even after securing the magnetic sensor device 3 to the substrate 31, loosening or unfastening the fasteners allows for the position of the magnetic sensor device 3 to be readily adjusted and allows for the magnetic sensor device 3 to be removed from the motor and re-attached to the motor without removing the substrate 31 from the housing 41.

In addition, in the magnetic sensor device 3 according to the inventive embodiment, the three magnetic sensors 4 are accommodated in the casing 22 and, within the casing 22, the three magnetic sensors 4 are disposed and secured at predetermined locations for sensing the rotation of the rotary shaft 40. That is, within the casing 22, the three magnetic sensors 4 are disposed on one reference plane S coincident with the lower face of the casing 22 at 120-degree intervals in the circumferential direction about the reference line Q perpendicular to the reference plane S and in such a manner that the direction of extension of the magnetic wire rods 5 is parallel to the reference plane S. Therefore, the predetermined positional relationship of the magnetic field forming member 2 and the three magnetic sensors 4 used for sensing the rotation of the rotary shaft 40 can be determined conclusively and with high precision simply by mounting the casing 22 to the substrate 31. This makes it possible to perform the mounting of the three magnetic sensors 4 to the substrate 31 with greater ease and more precisely than, for example, when the positions of the magnetic sensors 4 relative to the rotary shaft 40 are determined on an individual basis for each magnetic sensor 4.

In addition, in the magnetic sensor device 3 according to the inventive embodiment, the three yokes 21 are accommodated in the casing 22 in addition to the three magnetic sensors 4 and, within the casing 22, the three magnetic sensors 4 and the three yokes 21 are disposed and secured at predetermined locations for sensing the rotation of the rotary shaft 40. Therefore, the predetermined positional relationship of the magnetic field forming member 2, three magnetic sensors 4, and three yokes 21 used for sensing the rotation of the rotary shaft 40 can be determined conclusively and with high precision simply by mounting the casing 22 to the substrate 31.

Figure 15:
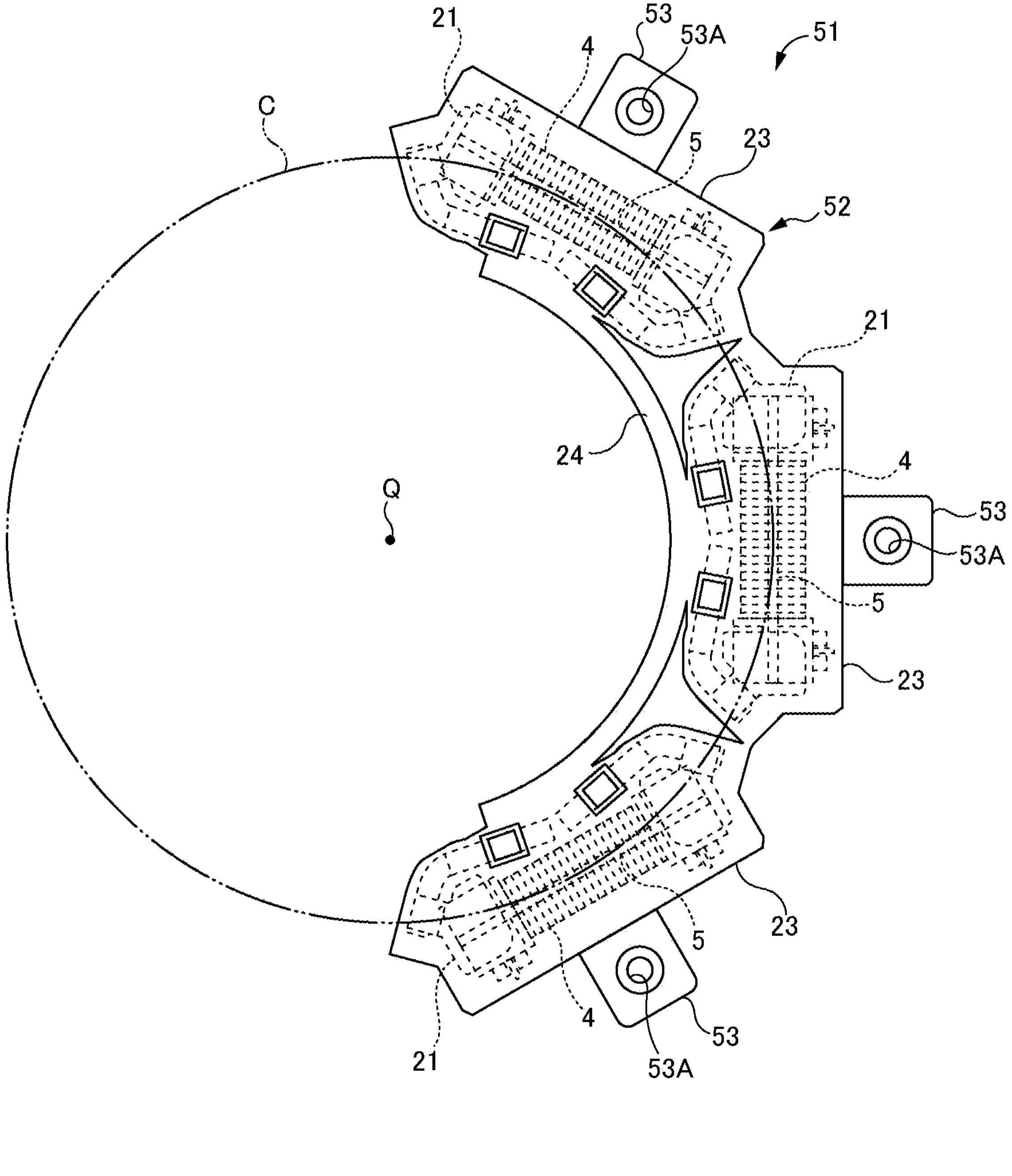
FIG. 15 is an illustrative view of a first variation of the magnetic sensor device according to the inventive embodiment.

It should be noted that while the aforementioned embodiment describes an example in which, in the casing 22 of the magnetic sensor device 3, the three magnetic sensors 4 are disposed at 120-degree intervals and the three yokes 21 are disposed at 120-degree intervals, the placement of the three magnetic sensors 4 and the placement of the three yokes 21 is not limited thereto. For example, as shown in FIG. 15, in the casing 52 of the magnetic sensor device 51, the three magnetic sensors 4 may be disposed at 60-degree intervals and the three yokes 21 may also be disposed at 60-degree intervals. In such a case, a plurality of sensor securing portions 53 are provided in the casing 52, and a bolt insertion hole 53A is provided in each sensor securing portion 53.

Figure 16:
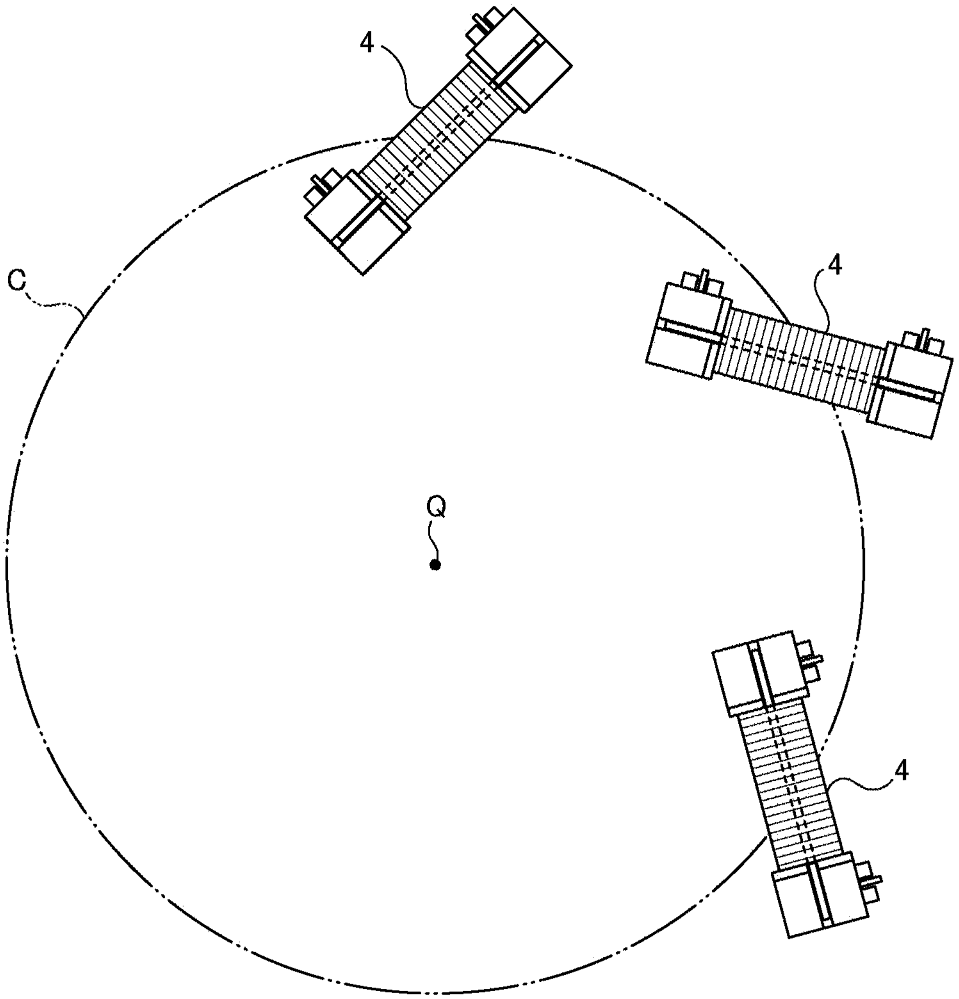
FIG. 16 is an illustrative view of a second variation of the magnetic sensor device according to the inventive embodiment.

In addition, while the aforementioned embodiment describes an example in which, in the casing 22, the three magnetic sensors 4 are disposed such that the central parts of the magnetic wire rods 5 in the direction of extension are tangential to the reference circle C when the casing 22 is viewed from above, the present invention is not limited thereto. For example, as shown in FIG. 16, the three magnetic sensors 4 may be disposed such that the magnetic wire rod 5 of each magnetic sensor 4 is transverse to the circumference of the reference circle C. It should be noted that in the case of such placement, the placement of the magnetic field forming member in the rotation sensing device (the magnetic poles or magnets used to form the rotating magnetic field) will also be different. As concerns the placement of the magnetic field forming member, Japanese Patent Application Publication No. 2019-200098 can be a useful reference. In addition, still other implementations of the placement of the plurality of magnetic sensors in the inventive magnetic sensor device can also be adopted.

In addition, while the aforementioned embodiment describes an example in which the reference plane S is a plane positioned coplanar with the lower face of the casing 22, the present invention is not limited thereto. The reference plane S may be a plane that is parallel to the lower face of the casing 22 and is positioned upwardly or downwardly of the lower face of the casing 22. In such a case, the vertical position of the lower face of each sensor securing portion 28 or the vertical position of the contact portion 19 of each terminal 15, etc., is to be adjusted in order to ensure the stability of attachment of the magnetic sensor device 3 to the mounting face 31A of the substrate 31 as well as ensure contact between each terminal 15 and a conductor portion 34.

Figure 17:
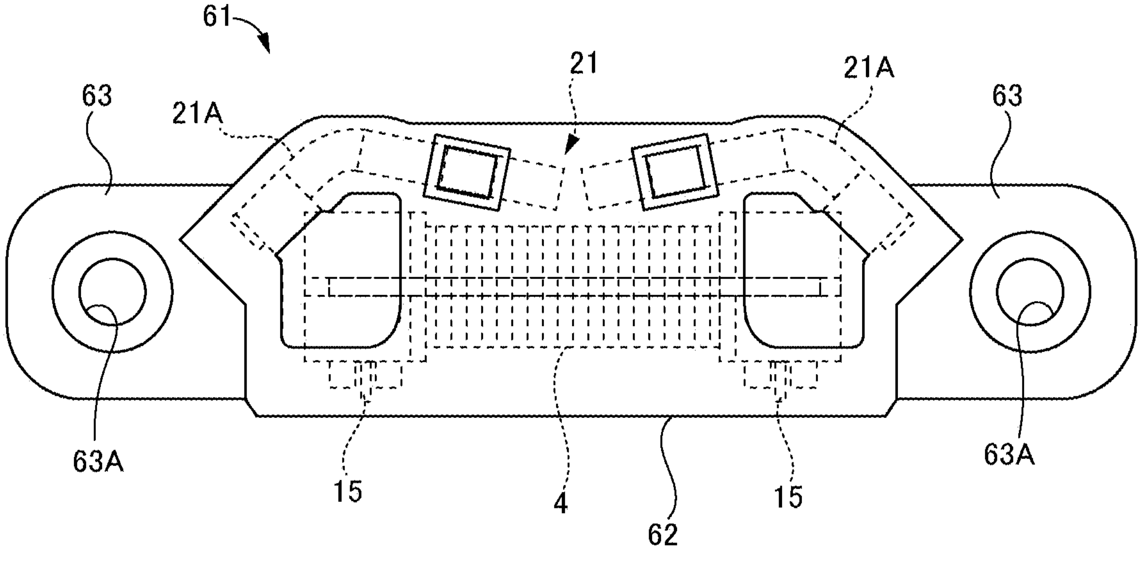
FIG. 17 is an illustrative view of another embodiment of the inventive magnetic sensor device.

In addition, the number of the magnetic sensors provided in the casing of the inventive magnetic sensor device is not limited to three and may also be one, two, four, or more. The same applies to the yokes. For example, in the magnetic sensor device 61 illustrated in FIG. 17, one magnetic sensor 4 and one yoke 21 made up of two yoke pieces 21A are accommodated within a casing 62. In addition, sensor securing portions 63 are provided respectively at opposite ends of the casing 62, and a bolt insertion hole 63A is provided in each sensor securing portion 63.

Figure 18:
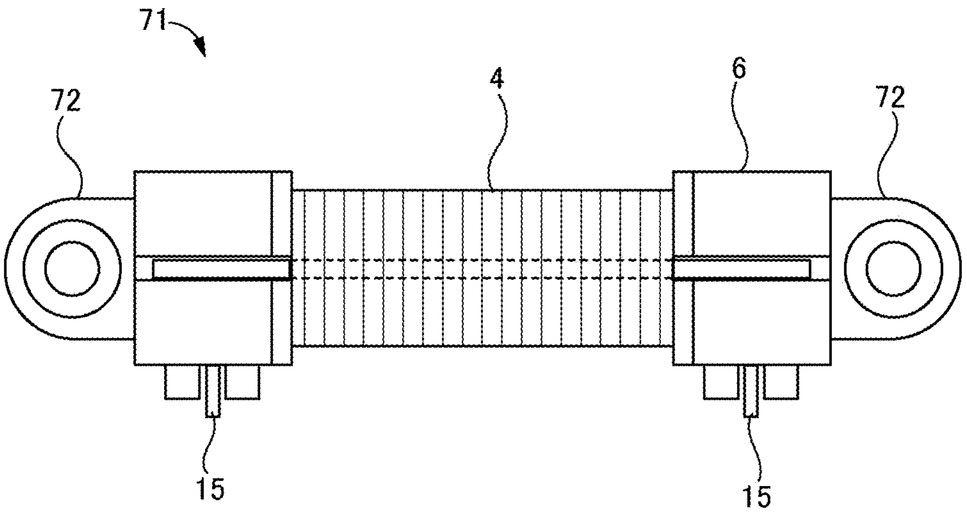
FIG. 18 is an illustrative view of yet another embodiment of the inventive magnetic sensor device.

In addition, a configuration in which no yokes are provided within the casing of the inventive magnetic sensor device can also be used. Furthermore, configurations without a casing are also contemplated as the inventive magnetic sensor device. For example, as shown in FIG. 18, the magnetic sensor device 71 may be configured with a magnetic sensor 4 and sensor securing portions 72 provided at opposite ends of the bobbin 6 of the magnetic sensor 4.

In addition, the fasteners used for securing the magnetic sensors or the casing to the substrate are not limited to bolts and nuts and may be, for example, rivets, clips, and the like. In addition, the present invention can be used for purposes other than sensing the rotation of a rotary shaft.

Figure 19:
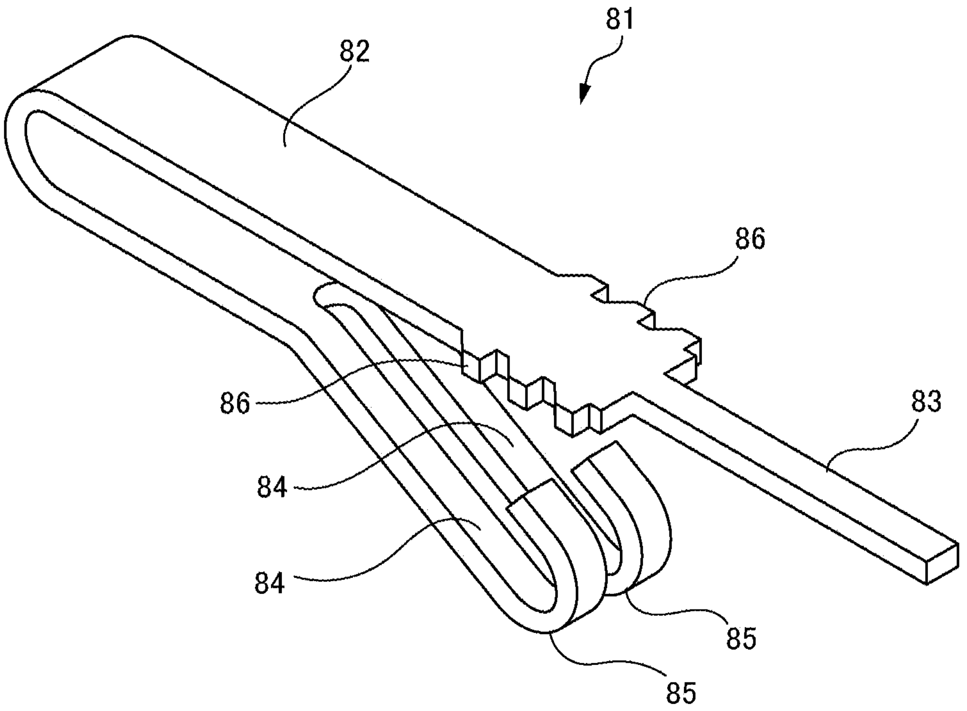
FIG. 19 is an illustrative view of a variation of the terminal used in the magnetic sensors of the inventive magnetic sensor device.

In addition, in the present invention, the terminals of the magnetic sensors are not limited to the terminals 15 illustrated in FIG. 6. For example, the terminal 81 illustrated in FIG. 19 may be used instead of terminal 15. The terminal 81, which is a compression terminal, comprises a base portion 82, an electrical wire connecting portion 83, two spring portions 84, and two contact portions 85. The base portion 82, which expands in the forward-backward and left-to-right direction, is formed in the shape of a plate elongated in the forward-backward direction. In addition, after bending downward through 180 degrees, the front end section of the base portion 82 extends rearward. The electrical wire connecting portion 83 extends rearward from the upper rear end portion of the base portion 82. Each spring portion 84 slopes downward while extending rearwardly from the end portion of the front end section of the base portion 82 bent through 180 degrees, i.e., the lower rear end portion of the base portion 82. Of the two spring portions 84, one spring portion 84 extends from the left end portion of the lower rear end portion of the base portion 82 and the other spring portion 84 extends from the right end portion of the lower rear end portion of the base portion 82. The contact portions 85 are provided at the lowermost and rearmost end of each spring portion 84. In addition, each contact portion 85 is bent upward from said end of the spring portion 84. In addition, engagement protrusions 86 are respectively provided at the left and right end of the base portion 82. The terminals 81, which comprise two spring portions 84 and two contact portions 85, have a structure designed for allowing each of the two contact portions 85 to make contact with one conductor portion 34 provided on the substrate 31. That is, the terminals 81 have two contact points for a single conductor portion 34. In addition, the two spring portions 84 are capable of undergoing resilient deformation independently of each other and, for this reason, the two contact portions 85 are capable of being displaced in the up-down direction independently of each other. The thus-configured terminals 81 can increase the reliability of contact with the conductor portions 34.

In addition, the present invention can be modified as appropriate where consistent with the essence or concept of the invention that can be read from the claims and the description in their entirety, and magnetic sensor devices featuring such modifications are also included within the technical concept of the present invention.

DESCRIPTION OF THE REFERENCE NUMERALS

3, 51, 61, 71 Magnetic sensor devices
4 Magnetic sensor
5 Magnetic wire rod
6 Bobbin
15, 81 Terminals
21 Yoke
22, 52, 62 Casings
28, 53, 63, 72 Sensor securing portions
29 Bolt (fastener)
30 Nut (fastener)
S Reference plane
Q Reference line

The invention claimed is:

1. A magnetic sensor device, comprising:

a magnetic sensor having a magnetic wire rod that generates a Barkhausen effect, a bobbin having the magnetic wire rod disposed therein, a coil formed by winding an electrical wire around the bobbin, and two terminals provided in the bobbin and intended for respectively electrically connecting one end and an other end of the electrical wire to two conductor portions provided on a substrate; and sensor securing portions for securing the magnetic sensor to the substrate with fasteners, wherein the two terminals are both compression terminals, and, as the magnetic sensor is secured to the substrate by the sensor securing portions and the fasteners, the two terminals are respectively pressed against the two conductor portions and electrically connected to the two conductor portions, and wherein the magnetic sensor is configured to be position-adjusted after it has been mounted to the substrate.

2. The magnetic sensor device according to claim 1, comprising a yoke that controls a direction of the magnetic flux of an external magnetic field, and a casing in which the magnetic sensor and the yoke are accommodated, wherein the sensor securing portions are provided in the casing.

3. The magnetic sensor device according to claim 1, comprising:

a plurality of magnetic sensors, and a casing in which the plurality of magnetic sensors are accommodated, wherein the plurality of magnetic sensors are disposed on a single reference plane coincident with or parallel to a lower face of the casing, at predetermined intervals in a circumferential direction about a reference line perpendicular to the reference plane and such that the direction of extension of the magnetic wire rods is parallel to the reference plane.

4. The magnetic sensor device according to claim 3, comprising:

a plurality of yokes that control the direction of magnetic flux of an external magnetic field, wherein the plurality of yokes are provided in one-to-one correspondence with the plurality of magnetic sensors, and the plurality of yokes are accommodated in the casing along with the plurality of magnetic sensors.

* * * * *